(12) United States Patent
Basu

(10) Patent No.: US 9,276,077 B2
(45) Date of Patent: Mar. 1, 2016

(54) CONTACT METALLURGY FOR SELF-ALIGNED HIGH ELECTRON MOBILITY TRANSISTOR

(71) Applicant: GLOBALFOUNDRIES INC., Grand Cayman (KY)

(72) Inventor: Anirban Basu, Elmsford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/898,580

(22) Filed: May 21, 2013

(65) Prior Publication Data

US 2014/0346566 A1  Nov. 27, 2014

(51) Int. Cl.
| | |
|---|---|
| *H01L 29/66* | (2006.01) |
| *H01L 29/45* | (2006.01) |
| *H01L 29/778* | (2006.01) |
| *H01L 21/285* | (2006.01) |
| *H01L 29/20* | (2006.01) |

(52) U.S. Cl.
CPC .......... *H01L 29/45* (2013.01); *H01L 21/28575* (2013.01); *H01L 29/452* (2013.01); *H01L 29/66431* (2013.01); *H01L 29/778* (2013.01); *H01L 21/28587* (2013.01); *H01L 29/2003* (2013.01)

(58) Field of Classification Search
CPC ................... H01L 29/66431; H01L 29/66462; H01L 29/778; H01L 29/7781; H01L 29/7782; H01L 2924/13064
USPC .................................................... 257/194, 43
See application file for complete search history.

(56) References Cited

U.S. PATENT DOCUMENTS

| | | | |
|---|---|---|---|
| 5,523,587 | A | 6/1996 | Kwo |
| 6,680,485 | B1 | 1/2004 | Carey et al. |
| 7,238,560 | B2 | 7/2007 | Sheppard et al. |
| 7,638,818 | B2 | 12/2009 | Wu et al. |
| 7,972,915 | B2 | 7/2011 | Chen et al. |

(Continued)

FOREIGN PATENT DOCUMENTS

| | | |
|---|---|---|
| CN | 101710590 B | 12/2011 |
| CN | 102148154 B | 10/2012 |

OTHER PUBLICATIONS

Mohammed et al. Si-induced enhancement of ohmic performance of Ti/Al/Mo/Au metallization for AlGaN/GaN HEMTs. Electronics Letters. vol. 41 No. 1 (Aug. 2005).*

(Continued)

*Primary Examiner* — Matthew Landau
*Assistant Examiner* — Eric Ashbahian
(74) *Attorney, Agent, or Firm* — Scully, Scott, Murphy & Presser, P.C.

(57) ABSTRACT

A metallization scheme employing a first refractory metal barrier layer, a Group IIIA element layer, a second refractory metal barrier layer, and an oxidation-resistant metallic layer is employed to form a source region and a drain region that provide electrical contacts to a compound semiconductor material layer. The first and second refractory metal barrier layer are free of nitrogen, and thus, do not introduce additional nitrogen into the compound semiconductor layer, while allowing diffusion of the Group IIIA element to form locally doped regions underneath the source region and the drain region. Ohmic contacts may be formed at a temperature as low as about 500° C. This enables fabrication of FET whose source and drain are self-aligned to the gate.

14 Claims, 19 Drawing Sheets

(56) References Cited

U.S. PATENT DOCUMENTS

| | | | |
|---|---|---|---|
| 8,624,296 B1* | 1/2014 | Wong et al. | 257/194 |
| 2004/0227154 A1* | 11/2004 | Chu et al. | 257/194 |
| 2004/0256614 A1 | 12/2004 | Ouyang et al. | |
| 2006/0157733 A1* | 7/2006 | Lucovsky et al. | 257/192 |
| 2006/0220165 A1* | 10/2006 | Hase | 257/471 |
| 2006/0226442 A1 | 10/2006 | Zhang et al. | |
| 2007/0114569 A1 | 5/2007 | Wu et al. | |
| 2010/0184262 A1 | 7/2010 | Smorchkova et al. | |
| 2010/0244105 A1* | 9/2010 | Hwang | 257/280 |
| 2012/0056161 A1* | 3/2012 | Avouris et al. | 257/24 |
| 2012/0097973 A1 | 4/2012 | Shi et al. | |
| 2012/0146046 A1 | 6/2012 | Ohki et al. | |
| 2012/0210932 A1 | 8/2012 | Hekmatshoartabari et al. | |
| 2012/0280244 A1 | 11/2012 | Hwang et al. | |
| 2013/0009133 A1 | 1/2013 | Avouris et al. | |
| 2013/0256753 A1* | 10/2013 | Morizuka et al. | 257/192 |
| 2013/0264579 A1* | 10/2013 | Bridger | H01L 29/0692 257/76 |
| 2014/0131720 A1* | 5/2014 | Hsiung et al. | 257/76 |
| 2014/0203289 A1* | 7/2014 | Liu et al. | 257/76 |

OTHER PUBLICATIONS

Ohmi, T. et al., "Very-Low-Temperature Epitaxial Silicon Growth by Low-Kinetic-Energy Particle Bombardment" Japanese Journal of Applied Physics (Nov. 1998) pp. L2146-L2148, vol. 27, No. 11.

Ohmi, T. et al., "In situ-doped epitaxial silicon film growth at 250 degrees C by an ultra-clean low-energy bias sputtering" IEEE International Electron Devices Meeting, IEDM '89, Technical Digest (Dec. 3-6, 1989) pp. 53-56.

Shahrjerdi, D. et al., "Low-Temperature Epitaxy of Compressively Strained Silicon Directly on Silicon Substrates" Journal of Electronic Materials (Mar. 2012) pp. 494-497, vol. 41, No. 3.

Office Action dated Feb. 27, 2014 received in related U.S. Appl. No. 14/019,713.

Notice of Allowance dated Jul. 1, 2014 received in U.S. Appl. No. 14/019,717.

Office Action dated Nov. 21, 2014 received in U.S. Appl. No. 13/898,585.

\* cited by examiner

US 9,276,077 B2

CONTACT METALLURGY FOR SELF-ALIGNED HIGH ELECTRON MOBILITY TRANSISTOR

RELATED APPLICATIONS

The present application is related to U.S. patent application Ser. No. 13/898,585 filed on May 21, 2013 and now issued as U.S. Pat. No. 9,231,094, the entire contents of which are incorporated herein by reference.

BACKGROUND

The present disclosure relates to a semiconductor structure, and particularly to contact metallurgy for self-aligned high electron mobility transistors (HEMT's) and methods of manufacturing the same.

Most metallization schemes for high electron mobility transistors require a high annealing temperature above 900° C. to form low resistance Ohmic contact to a compound semiconductor material such as AlGaN. However, the integrity of a gate electrode for a high electron mobility transistor is compromised above 600° C. due to the reaction with aluminum in an Ohmic metallization scheme. Thus, use of such a high temperature anneal prohibits formation of truly self-aligned high electron mobility transistors in which a source region and a drain region are self-aligned to a gate electrode. Further, most of high electron mobility transistors are formed as normally-on devices, and it is difficult to provide a high electron mobility transistor that is normally turned off, i.e., turned off when no electrical bias is applied to the gate electrode.

SUMMARY

A metallization scheme employing a first refractory metal barrier layer, a Group IIIA element layer, a second refractory metal barrier layer, and an oxidation-resistant metallic layer is employed to form a source region and a drain region that provide electrical contacts to a compound semiconductor material layer. The first and second refractory metal barrier layer are free of nitrogen, and thus, do not introduce additional nitrogen into the compound semiconductor layer, while allowing diffusion of the Group IIIA element to form locally doped regions underneath the source region and the drain region. Ohmic contacts may be formed at a temperature as low as about 500° C. Optionally, a fluorine-based plasma treatment may be performed within an opening in a dielectric material layer prior to formation of a gate electrode therein. In this case, fluorine atoms can be incorporated in a portion of the compound semiconductor layer underneath the gate electrode to provide a normally-off device. Optionally, a portion of the channel may be recessed prior to formation of the gate electrode. The dielectric material layer may be removed from around the gate electrode.

According to an aspect of the present disclosure, a semiconductor structure including a high electron mobility transistor (HEMT) is provided. The HEMT includes a substrate containing a stack of a substrate compound semiconductor layer and a top compound semiconductor layer, and a gate electrode contacting a horizontal surface of a portion of the top compound semiconductor layer. The HEMT further includes a source region contacting a first portion of a top surface of the top compound semiconductor layer, and a drain region contacting a second portion of the top surface of the top compound semiconductor layer. The second portion is laterally spaced from the first portion by a width of the gate electrode. Each of the source region and the drain region includes a vertical stack, from bottom to top, of a first refractory metal barrier layer, a Group IIIA element layer, a second refractory metal barrier layer, and an oxidation-resistant metallic layer.

According to another aspect of the present disclosure, a method of forming a semiconductor structure is provided. A substrate including a vertical stack of a substrate compound semiconductor layer and a top compound semiconductor layer is provided. A gate electrode is formed on a horizontal surface of a portion of the top compound semiconductor layer. A source region and a drain region are formed on portions of a top surface of the top compound semiconductor layer. The second portion is laterally spaced from the first portion by a width of the gate electrode. Each of the source region and the drain region includes a vertical stack, from bottom to top, of a first refractory metal barrier layer, a Group IIIA element layer, a second refractory metal barrier layer, and an oxidation-resistant metallic layer.

DETAILED DESCRIPTION

Figure 1:
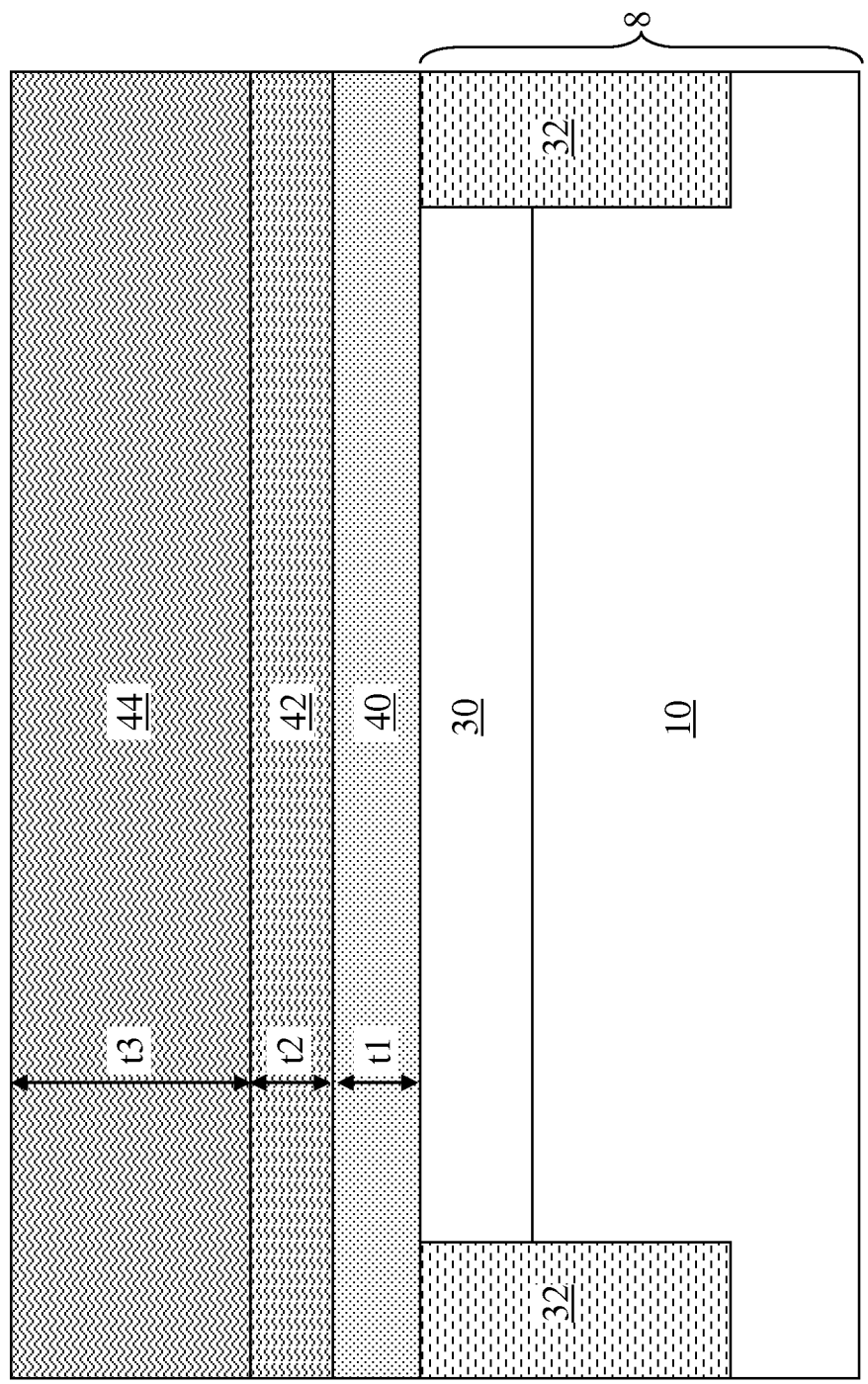
FIG. 1 is a vertical cross-sectional view of a first exemplary semiconductor structure after formation of a dielectric material layer, a first photoresist layer, and a second photoresist layer according to a first embodiment of the present disclosure.

As stated above, the present disclosure relates to contact metallurgy for self-aligned high electron mobility transistors (HEMT's) and methods of manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

As used herein, a high electron mobility transistor (HEMT) refers to a field-effect transistor incorporating a junction between two materials with different band gaps as the channel through which charge carriers flow.

Referring to FIG. 1, a first exemplary semiconductor structure according to a first embodiment of the present disclosure includes a substrate 8 and a stack of material layers formed thereupon. The substrate 8 includes a vertical stack of a substrate compound semiconductor layer 10 and a top compound semiconductor layer 30. The substrate compound semiconductor layer 10 includes a first single crystalline compound semiconductor material. As used herein, a compound semiconductor material refers to a semiconductor material formed by at least two different elements belonging to different groups in the Periodic Table of the Elements. The compound semiconductor material can be a III-V compound semiconductor material or a II-VI compound semiconductor material. As used herein, a single crystalline compound semiconductor material refers to a compound semiconductor material in which atoms are located in a crystallographic lattice. In one embodiment, the first single crystalline compound semiconductor material can be single crystalline gallium nitride (GaN) or single crystalline gallium arsenide (GaAs). In one embodiment, the thickness of the substrate compound semiconductor layer 10 can be in a range from 500 nm to 1 mm, although lesser and greater thicknesses can also be employed.

The top compound semiconductor layer 30 includes a second single crystalline compound semiconductor material having a greater charge carrier mobility than the first single crystalline compound semiconductor material. In one embodiment, the second single crystalline compound semiconductor material can have a greater electron mobility than the first single crystalline compound semiconductor material. The top compound semiconductor layer 30 is epitaxially aligned to the substrate compound semiconductor layer 10 so that the entire stack of the substrate compound semiconductor layer 10 and the top compound semiconductor layer 30 is single crystalline, i.e., has an epitaxial alignment throughout the entirety thereof. In one embodiment, the substrate compound semiconductor layer 10 can include gallium nitride (GaN), and the top compound semiconductor layer 30 can include aluminum gallium nitride ($Al_xGa_{1-x}N$) in which x can be in a range, for example, from 0.20 to 0.35. In another embodiment, the substrate compound semiconductor layer 10 can include gallium nitride (GaAs), and the top compound semiconductor layer 30 can include aluminum gallium nitride ($Al_xGa_{1-x}As$) in which x can be in a range, for example, from 0.01 to 0.40. The top compound semiconductor layer 30 can be formed, for example, by molecular beam epitaxy (MBE) or chemical vapor deposition (CVD). In one embodiment, the thickness of the top compound semiconductor layer 30 can be in a range from 15 nm to 50 nm, although lesser and greater thicknesses can also be employed. Optionally, shallow trench isolation structures 32 can be formed in the substrate 8 to provide electrical isolation between multiple semiconductor devices to be formed therein.

In one embodiment, the stack of material layers formed on the top surface of the substrate 10 can include, from bottom to top, a dielectric material layer 40, a first photoresist layer 42, and a second photoresist layer 44. The dielectric material layer 40 includes a dielectric material such as silicon nitride, silicon oxide, silicon oxynitride, or a combination thereof. The dielectric material layer 40 can be deposited, for example, by chemical vapor deposition (CVD). The thickness of the dielectric material layer 40 is herein referred to as a first thickness t1, and can be, for example, from 15 nm to 100 nm, although lesser and greater thicknesses can also be employed.

The first photoresist layer 42 and the second photoresist layer 44 are selected such that the material of the first photoresist layer 42 and the material of the second photoresist layer 44 are of the same type and have different sensitivities to irradiation, which can be irradiation by an electron beam or an ultraviolet radiation.

For example, the first photoresist layer 42 and the second photoresist layer 44 are selected such that the material of the first photoresist layer 42 are positive photoresists, i.e., photoresists in which the portions exposed to light becomes soluble to a photoresist developer solution while the unexposed portions remain insoluble. In this case, the second photoresist layer 44 can be more sensitive to irradiation than the first photoresist layer 42. In an illustrative example, the first and second photoresist layers (42, 44) can include compounds having different compositions and including poly (methyl methacrylate) at different concentrations.

Alternately, the first photoresist layer 42 and the second photoresist layer 44 are selected such that the material of the first photoresist layer 42 are negative photoresists, i.e., photoresists in which the portions exposed to light becomes insoluble to a photoresist developer solution while the unexposed portions remain soluble. In this case, the second photoresist layer 44 can be less sensitive to irradiation than the first photoresist layer 42.

The thickness of the first photoresist layer 42 is herein referred to as a second thickness t2, and can be in a range from 20 nm to 50 nm, although lesser and greater thicknesses can also be employed. The thickness of the second photoresist layer 44 is herein referred to as a third thickness t3, and can be in a range from 40 nm to 200 nm, although lesser and greater thicknesses can also be employed.

Figure 2:
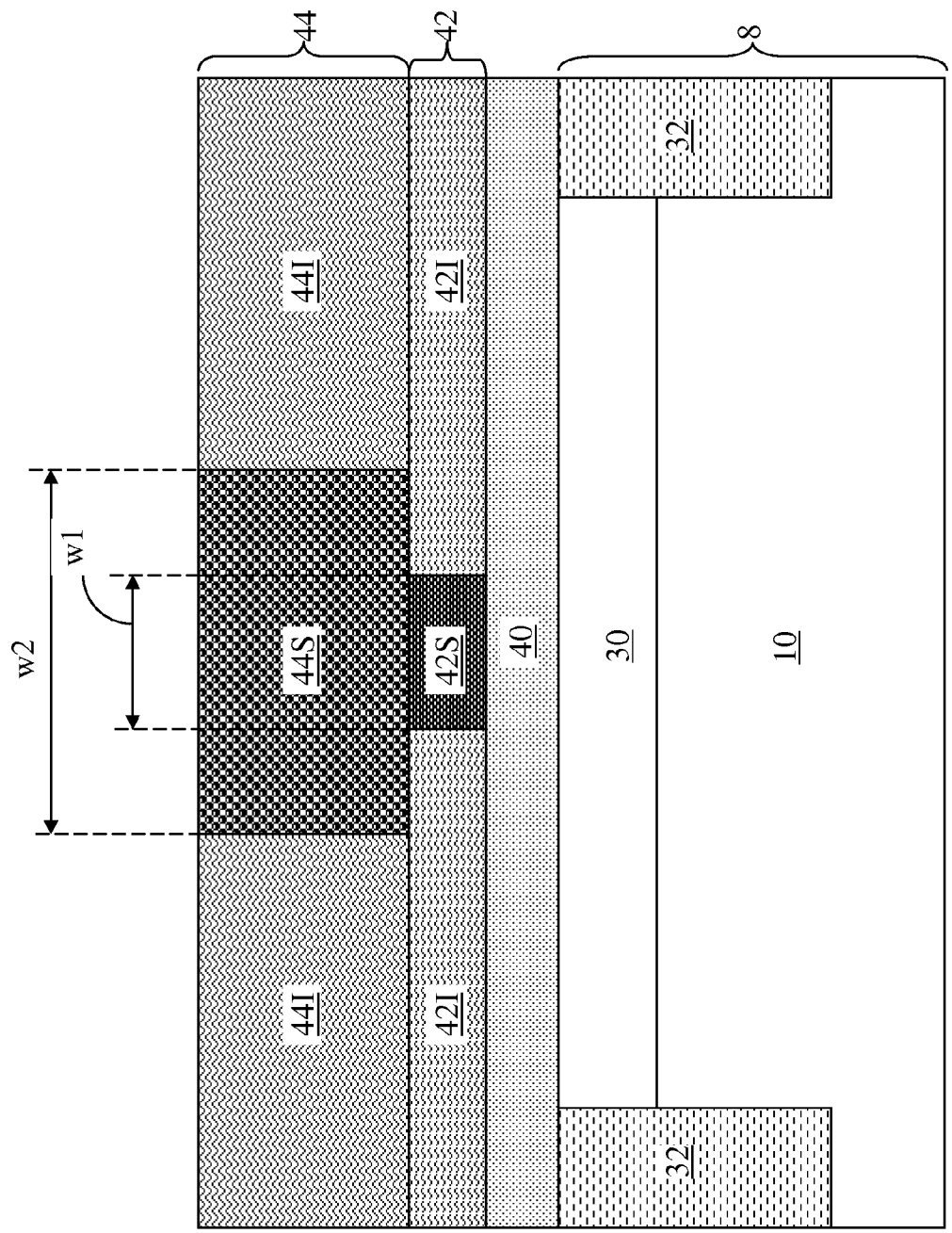
FIG. 2 is a vertical cross-sectional view of the first exemplary semiconductor structure after lithographic exposure of the first and second photoresist layers according to the first embodiment of the present disclosure.

Referring to FIG. 2, the first photoresist layer 42 and the second photoresist layer 44 can be lithographically exposed such that the intensity of radiation gradually decreases in peripheral regions. The gradual decrease of the intensity of radiation may be achieved, for example, by defocusing the radiation, i.e., shifting the distance between a lithographic mask and the first and second photoresist layers (42, 44) from an optimal distance.

A soluble first photoresist portion 42S and an insoluble first photoresist portion 42I are formed within the first photoresist layer 42. In one embodiment, the soluble first photoresist portion 42S can have a uniform width that is invariant along a horizontal direction perpendicular to the plane of FIG. 2. This uniform width is herein referred to as a first width w1. Simultaneously, a soluble second photoresist portion 44S and an insoluble second photoresist portion 44I are formed within the second photoresist layer 44. In one embodiment, the soluble second photoresist portion 44S can have a uniform width that is invariant along a horizontal direction perpendicular to the plane of FIG. 2. This uniform width is herein referred to as a second width w2.

The polarity and the sensitivities of the photoresist materials of first and second photoresist layers (42, 44) are selected such that the second width w2 is greater than the first width w1. In one embodiment, the sidewalls of the soluble second photoresist portion 44S can be laterally offset from a proximal sidewall of the soluble first photoresist portion 42S by a same distance, i.e., (w2−w1)/2, which is herein referred to as a lateral offset distance. In one embodiment, the first width w1 can be in a range from 10 nm to 100 nm, and the second width w2 can be in a range from 15 nm to 150 nm, and the lateral offset distance can be in a range from 2.5 nm to 250 nm, although lesser and greater distances can also be employed.

Figure 3:
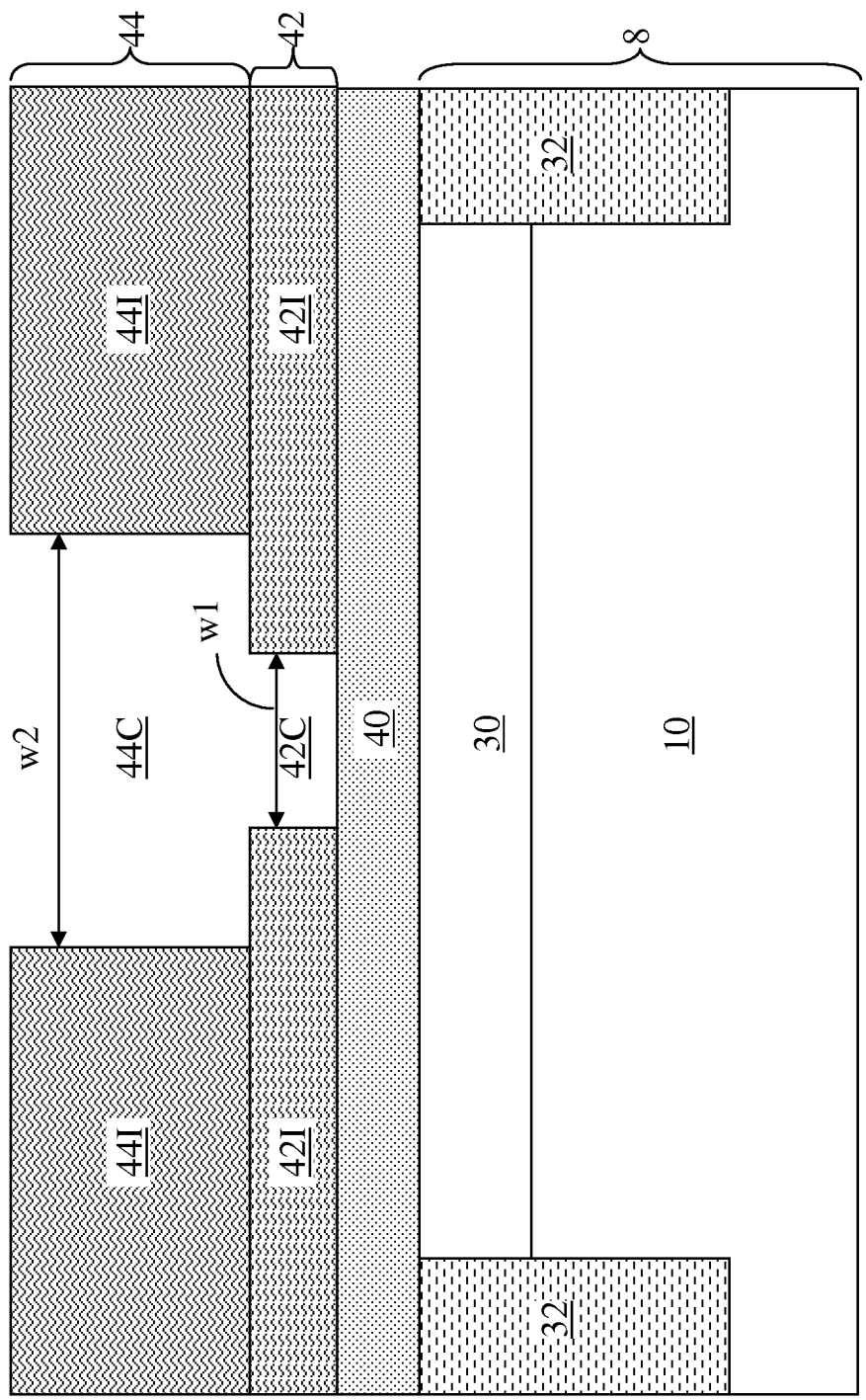
FIG. 3 is a vertical cross-sectional view of the first exemplary semiconductor structure after development of the first and second photoresist layers according to the first embodiment of the present disclosure.

Referring to FIG. 3, the soluble first photoresist portion 42S and the soluble second photoresist portion 44S can be removed, for example, by dissolving in a developer solution. A first opening 42C is formed in a volume from which the soluble first photoresist portion 42S is removed, and a second opening 44C is formed in a volume from which the soluble second photoresist portion 44S is removed. The first opening 42C can have the first width w1, and the second opening 44C can have the second width w2.

The insoluble second photoresist portion 44I constitutes a template material layer including an opening, i.e., the second opening 44C, therein. The template material layer is formed over the dielectric material layer 40 prior to transfer of the pattern in the insoluble first photoresist portion 42I into the dielectric material layer 40.

Figure 4:
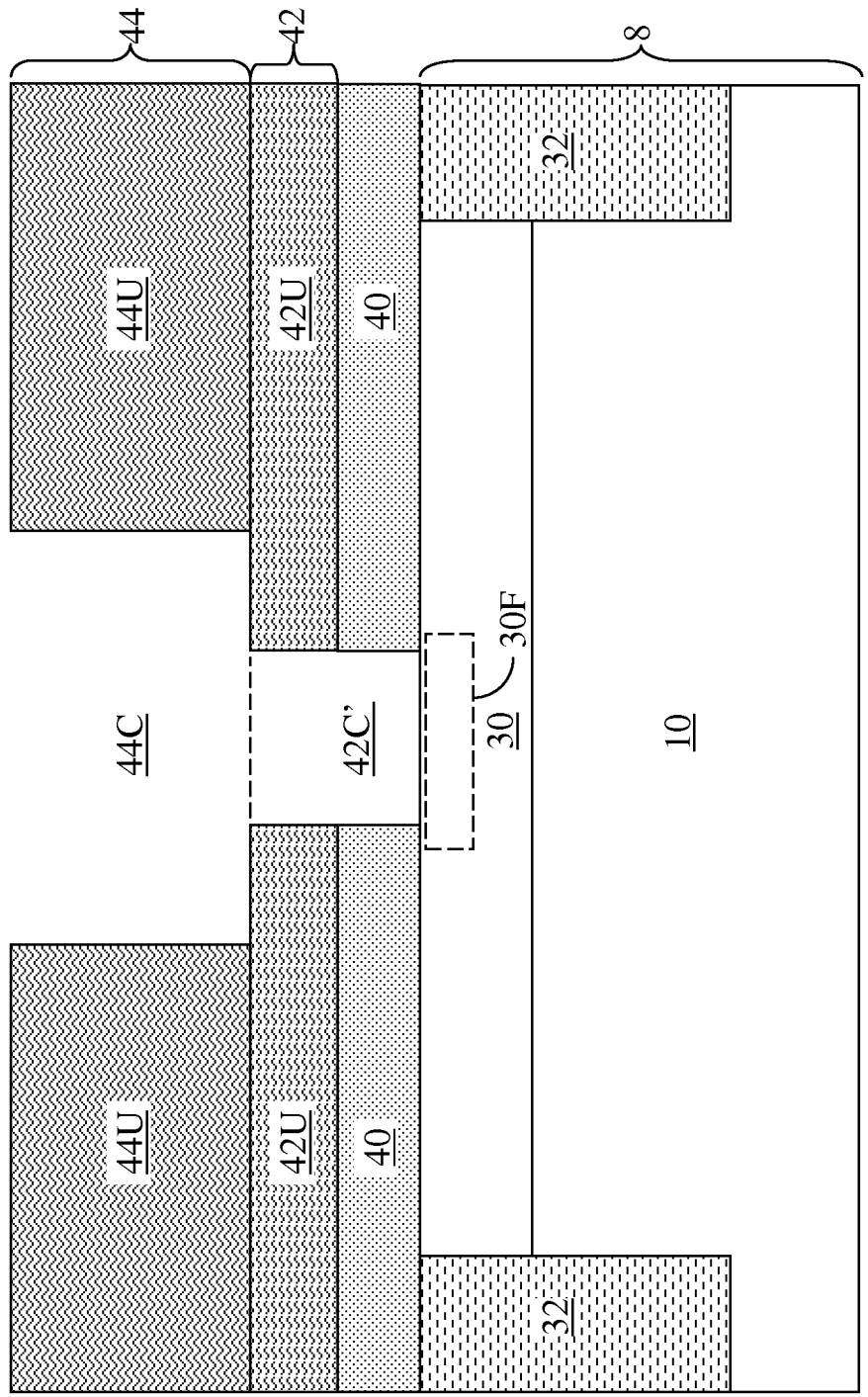
FIG. 4 is a vertical cross-sectional view of the first exemplary semiconductor structure after forming a cavity in the dielectric material layer employing the first photoresist layer as an etch mask and optionally forming a fluorine-doped region according to the first embodiment of the present disclosure.

Referring to FIG. 4, the pattern in the insoluble first photoresist portion 42I can be transferred into the dielectric material layer 40 by an anisotropic etch. The anisotropic etch employs a remaining portion of the first photoresist layer 42, i.e., the insoluble first photoresist portion 42I, as an etch mask. A cavity 42C' that replicates the pattern of the first opening 42C is formed in the dielectric material layer 40. The second opening 44C in the template material layer, i.e., the insoluble second photoresist portion 44I, can overlie the entirety of the cavity 42C'. A portion of the top surface of the top compound semiconductor layer 30 is physically exposed within the cavity 42C'.

Optionally, the anisotropic etch can employ a fluorine-including gas during formation of the cavity 42C' through the dielectric material layer 40. Further, the anisotropic etch can continue after the top surface of the top compound semiconductor layer 30 is physically exposed with a decreased plasma intensity. In this case, fluorine atoms in the plasma can be introduced into the top compound semiconductor layer 30 without significantly etching the second single crystalline compound semiconductor material, and can form a fluorine-doped region 30F. The fluorine-doped region 30F can be formed in a surface portion of the top compound semiconductor layer 30 directly underneath the cavity 42C' in the dielectric material layer 40. The fluorine-doped region 30F can have a thickness less than the thickness of the top compound semiconductor layer 30, i.e., can be vertically spaced from the substrate compound semiconductor layer 10. In one embodiment the fluorine-doped region 30F can have a thickness in a range from 3 nm to 10 nm, although lesser and greater thicknesses can also be employed.

Figure 5:
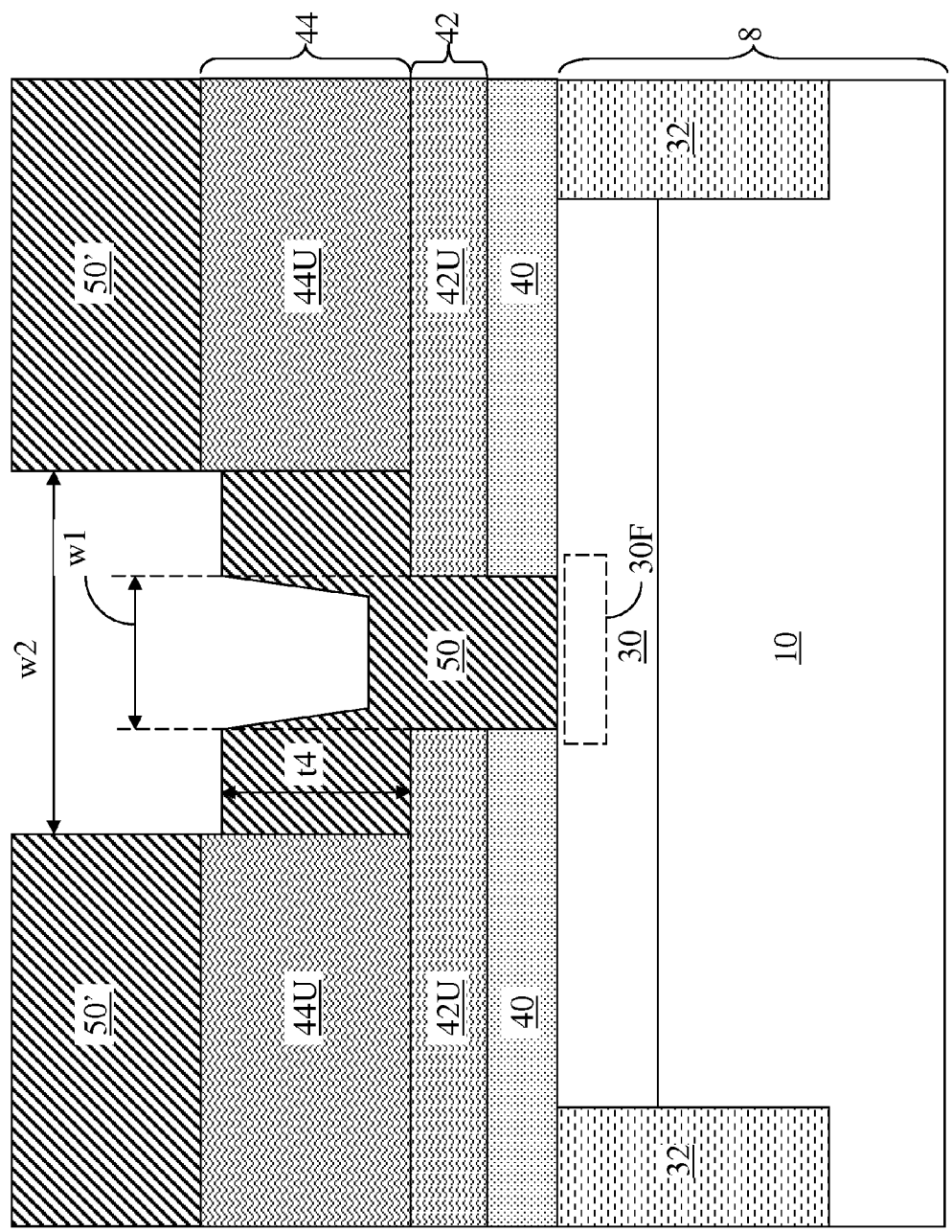
FIG. 5 is a vertical cross-sectional view of the first exemplary semiconductor structure after formation of a gate electrode by a directional deposition of at least one conductive material according to the first embodiment of the present disclosure.

Referring to FIG. 5, at least one conductive material can be directionally deposited in the cavity 42C', in the second opening 44C, and over the second photoresist layer 44. The directional deposition of the at least one conductive material can be performed, for example, by vacuum evaporation or a directional physical vapor deposition (PVD). The at least one conductive material can include, for example, a metallic material such as W, WN, Ni, Au, and/or combinations or alloys thereof.

A gate electrode 50 can be formed on a horizontal surface of a physically exposed portion of the top compound semiconductor layer 30, on sidewalls of the dielectric material layer 40 and the first photoresist layer 42, on a physically exposed top surface of the first photoresist layer 42, and sidewalls of the second photoresist layer 44. A conductive material portion 50' can be formed above the top surface of the second photoresist layer 44.

The thickness of the deposited conductive material(s) is herein referred to as a fourth thickness t4. The fourth thickness t4 is less than the third thickness t3, and is greater than the sum of the first thickness t1 and the second thickness t2.

The gate electrode 50 contacts a horizontal surface of a portion of the top compound semiconductor layer 10. The gate electrode 50 is a T-shaped gate electrode. The contact area in which the gate electrode 50 physically contacts a portion of the top compound semiconductor layer 30 has the first width t1. An upper portion of the gate electrode 50 includes a pair of sidewalls laterally spaced by the second width w2, which is greater than the first width w1.

Figure 6:
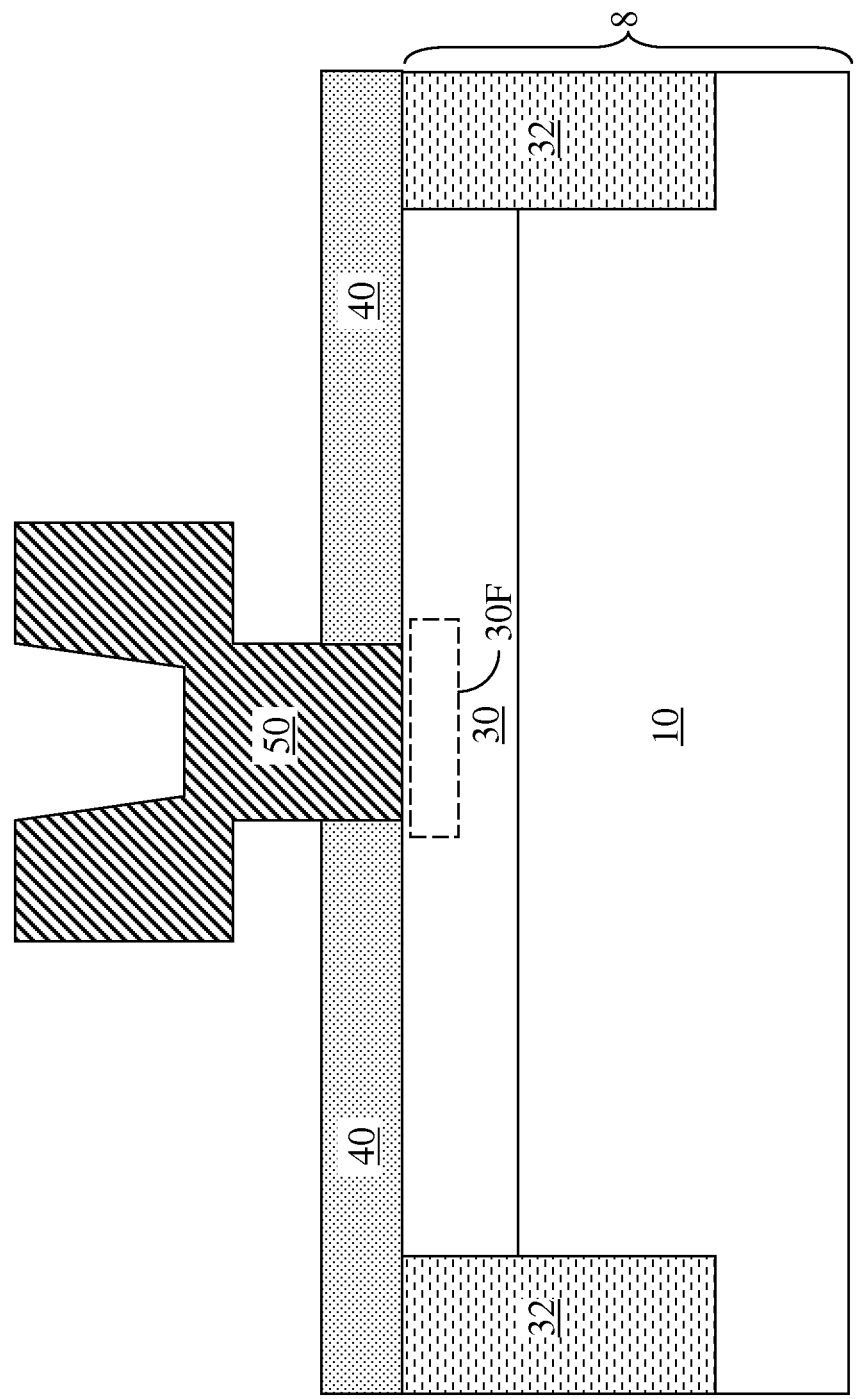
FIG. 6 is a vertical cross-sectional view of the first exemplary semiconductor structure after removing the first and second photoresist layers according to the first embodiment of the present disclosure.

Referring to FIG. 6, the first and second photoresist layers (42, 44) are removed selective to the dielectric material layer 40 and the gate electrode 50. For example, the first and second photoresist layers (42, 44) can be dissolved in an organic solvent, which does not dissolve the conductive material of the gate electrode 50 or the dielectric material layer 40. The conductive material portion 50' can be lifted off within the solvent as the first and second photoresist layers (42, 44) are dissolved. In one embodiment, the first exemplary semiconductor structure can be held upside down within the solvent to facilitate the lift-off of the conductive material portion 50' from the dielectric material layer 40.

Figure 7:
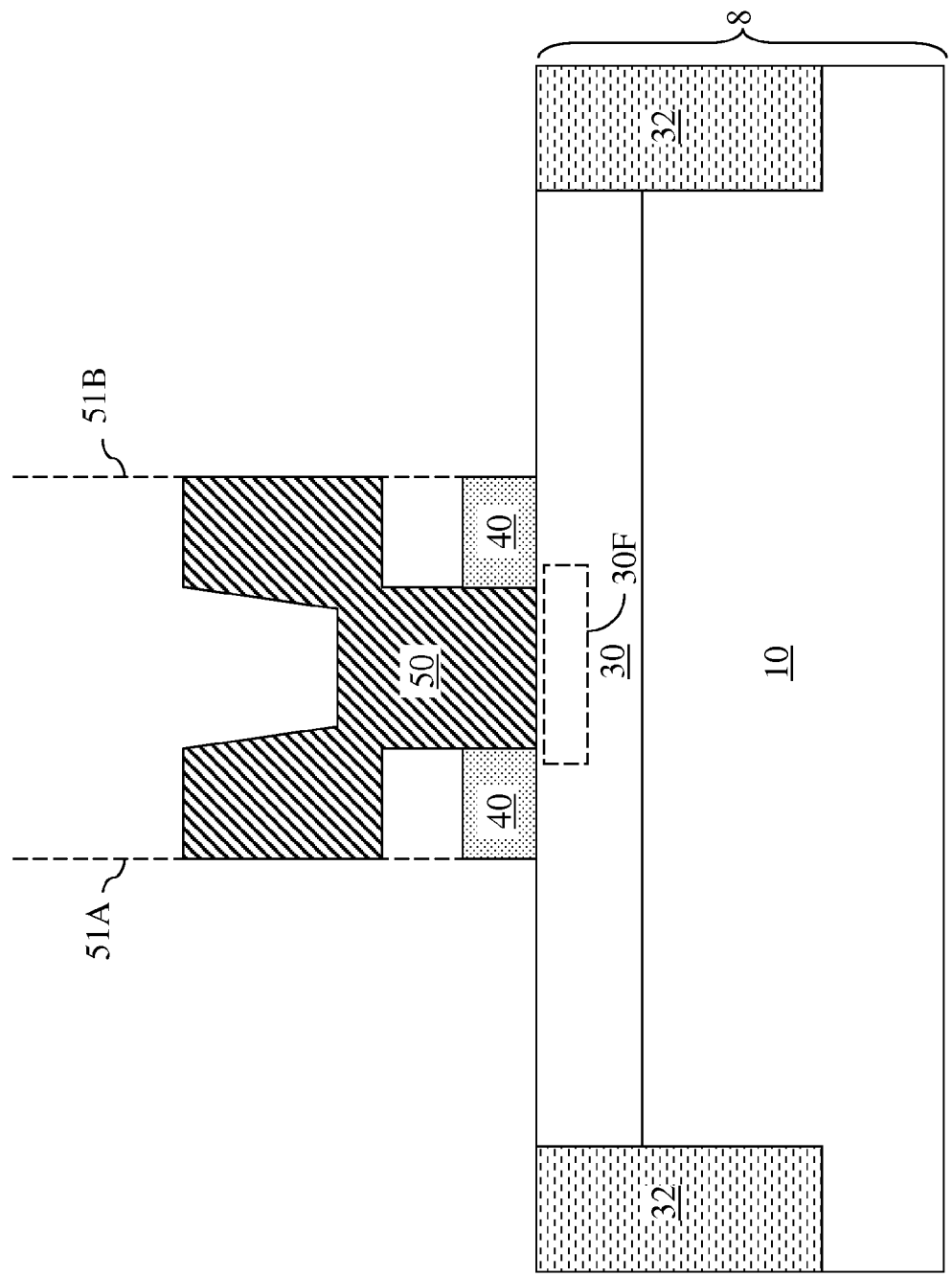
FIG. 7 is a vertical cross-sectional view of the first exemplary semiconductor structure after patterning the dielectric material layer according to the first embodiment of the present disclosure.

Referring to FIG. 7, the dielectric material layer 40 may be subsequently patterned by an anisotropic etch that employing the gate electrode 50 as an etch mask. The anisotropic etch can be, for example, a reactive ion etch that employs a hydrofluorocarbon gas such as $CF_4$, $CH_2F_2$, or $C_4F_8$. The anisotropic etch terminates upon detection of the physically exposed surfaces of the top compound semiconductor layer 30 to avoid introduction of fluorine into the top compound semiconductor layer 30. A wet clean may be optionally employed to remove any etch residue material from the physically exposed portions of the top surface of the top compound semiconductor layer 30.

A first sidewall of the remaining portion of the dielectric material layer 40 can be vertically coincident with a first sidewall of the upper portion of the gate electrode 50, and a second sidewall of the remaining portion of the dielectric material layer 40 can be vertically coincident with a second sidewall of the upper portion of the gate electrode 50. As used herein, two surfaces are "vertically coincident" with each other if there exists a vertical plane from which each of the two surfaces do not deviate by more than the sum of surface roughnesses of the two surfaces. The first sidewall of the upper portion of the gate electrode 50 and the first sidewall of the dielectric material layer 40 can be within a first vertical plane 51A, and the second sidewall of the upper portion of the gate electrode 50 and the second sidewall of the dielectric material layer 40 can be within a second vertical plane 51B.

Figure 8:
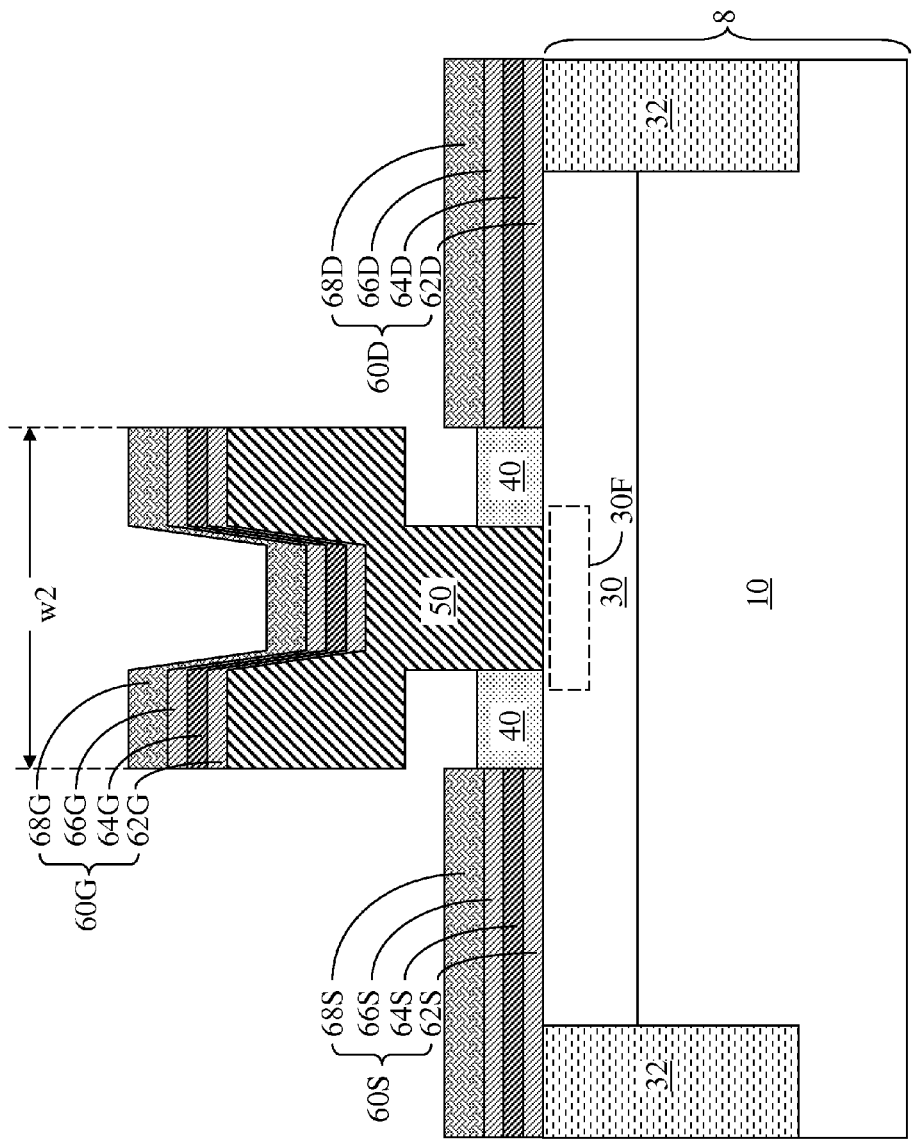
FIG. 8 is a vertical cross-sectional view of the first exemplary semiconductor structure after formation of a source region and a drain region by a directional deposition of metallic materials according to the first embodiment of the present disclosure.

Referring to FIG. 8, conductive materials can be deposited on the physically exposed top surfaces of the top semiconductor layer 30 and on the top surfaces of the gate electrode 50 employing a directional deposition method. The directional deposition method can be, for example, vacuum evaporation or collimated physical vapor deposition (PVD). Specifically, the conductive materials can include, in the order of the deposition sequence, a first refractory metal barrier material, a Group IIIA element material, a second refractory metal barrier material, and an oxidation-resistant metallic material.

The first refractory metal barrier material and the second refractory metal barrier material can be metallic materials that retard diffusion of other metallic materials therethrough. For example, the first refractory metal barrier material and the second refractory metal barrier material can be selected to retard diffusion of Group IIIA elements therethrough. In one embodiment, the first refractory metal barrier material and the second refractory metal barrier material can be selected to retard diffusion of aluminum atoms therethrough.

The first refractory metal barrier material and the second refractory metal barrier material can be essentially free of nitrogen. As used herein, a material is "essentially free of" an element if the concentration of the element in the material is at a trace level or below. As used herein, an element is at a "trace level" if the atomic concentration of the element is less than 1,000 parts per million (p.p.m.) or 0.1%. Thus, the first refractory metal barrier material and the second refractory metal barrier material is not a nitride of a metal. During a subsequent anneal, the first refractory metal barrier material and the second refractory metal barrier material do not contribute any nitrogen into the underlying first and second single crystalline compound semiconductor materials, but allows passage of some of the at least one Group III element material through the first refractory metal barrier material so that the underlying portions of the substrate compound semiconductor layer 10 and the top compound semiconductor layer 30 are doped with the at least one Group III element material.

In one embodiment, the first refractory metal barrier material can consist essentially of at least one first elemental refractory metal, and the second refractory metal barrier layer can consist essentially of at least one second elemental refractory metal. Each of the first elemental refractory metal and the second elemental refractory metal can be independently selected from a group of elemental metal elements consisting of Nb, Mo, Ta, W, and Re. Each of the first elemental refractory metal and the second elemental refractory metal can include a single elemental refractory metal, or can include a plurality of elemental refractory metals, i.e., can be an alloy of a plurality of elemental refractory metals. In one embodiment, the first refractory metal barrier layer and the second refractory metal barrier material can consist essentially of elemental molybdenum.

The Group IIIA element material can include any of the Group IIIA elements, i.e., B, Al, Ga, In, and Tl. In one embodiment, the Group IIIA element material can consist essentially of a single element selected from B, Al, Ga, In, and Tl. In one embodiment, the Group IIIA element material can consist essentially of aluminum.

The oxidation-resistant metallic material includes a metallic material that is resistant to oxidation. The oxidation-resistant metallic material can be, for example, Au, Ag, W, or a combination thereof.

A source region 60S is formed directly on a first portion of the top surface of the top compound semiconductor layer 30, and a drain region 60D is formed directly on a second portion of the top surface of the top compound semiconductor layer 30. The second portion is laterally spaced from the first portion by a width of the gate electrode, i.e., by the second width w2. A gate electrode contact structure 60G is formed directly on the top surface of the gate electrode 50.

Each of the source region 60S, the drain region 60D, and the gate electrode contact structure 60G includes a vertical stack, from bottom to top, of a first refractory metal barrier layer, a Group IIIA element layer, a second refractory metal barrier layer, and an oxidation-resistant metallic layer. For example, the source region 60S can include, from bottom to top, of a source-side first refractory metal barrier layer 62S, a source-side Group IIIA element layer 64S, a source-side second refractory metal barrier layer 66S, and a source-side oxidation-resistant metallic layer 68S. The drain region 60D can include, from bottom to top, of a drain-side first refractory metal barrier layer 62D, a drain-side Group IIIA element layer 64D, a drain-side second refractory metal barrier layer 66D, and a drain-side oxidation-resistant metallic layer 68D. The gate electrode contact structure 60G can include, from bottom to top, of a gate-side first refractory metal barrier layer 62G, a gate-side Group IIIA element layer 64G, a gate-side second refractory metal barrier layer 66G, and a gate-side oxidation-resistant metallic layer 68G.

The various first refractory metal barrier layers (62S, 62D, 62G) can have a same thickness, which can be in a range from 10 nm to 50 nm, although lesser and greater thicknesses can also be employed. The various Group IIIA element layers (64S, 64D, 64G) can have a same thickness, which can be in a range from 5 nm to 40 nm, although lesser and greater thicknesses can also be employed. The various second refractory metal barrier layers (66S, 66D, 66G) can have a same thickness, which can be in a range from 10 nm to 50 nm, although lesser and greater thicknesses can also be employed. The various oxidation-resistant metallic layers (68S, 68D, 68G) can have a same thickness, which can be in a range from 30 nm to 200 nm.

The total thickness of the source region 60S and the drain region 60D is controlled so as to avoid electrically shorting to the gate electrode 50, i.e., is selected to be less than the sum of the first thickness t1 and the second thickness t2 (See FIG. 1). A sidewall of the source region 60 can be vertically coincident with one of the pair of sidewalls of the upper portion of the gate electrode 50, i.e., within the first vertical plane 51A. A sidewall of the drain region 60 can be vertically coincident with another of the pair of sidewalls of the upper portion of the gate electrode 50, i.e., within the second vertical plane 51B.

Figure 9:
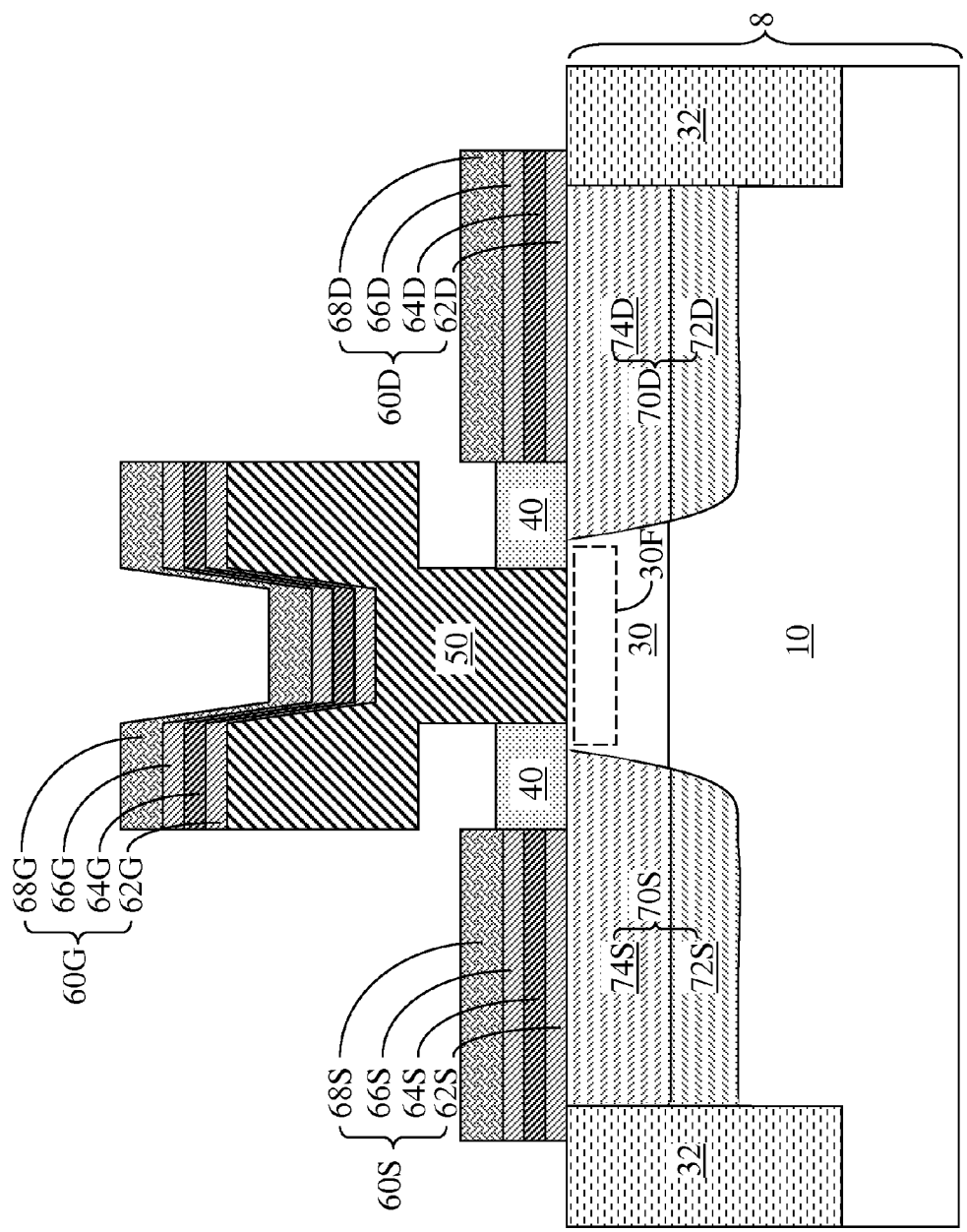
FIG. 9 is a vertical cross-sectional view of the first exemplary semiconductor structure after diffusion of a Group IIIA metal into portions of the top compound semiconductor layer and the substrate compound semiconductor layer according to the first embodiment of the present disclosure.

Referring to FIG. 9, the source region 60S and the drain region 60D may be optionally patterned, for example, by applying a photoresist layer (not shown), patterning the photoresist layer to cover regions laterally surrounded by the shallow trench isolation structures 32, and by removing portions of the source region 60S and the drain region 60D from above regions overlying non-peripheral portions of the shallow trench isolation structures 32. Patterning of the source regions 60S and the drain regions 60D can electrically isolate the source region 60S and the drain region 60D from adjacent electrical devices (not shown).

An anneal at an elevated temperature can be performed to enhance the adhesion of the source region 60S and the drain region 60D to the substrate 8. The combination of the first refractory metal barrier material, the Group IIIA element material, the second refractory metal barrier material, and the oxidation-resistant metallic material allows effective metallization of the source region 60S and the drain region 60D at an anneal temperature lower than about 500° C.

The Group IIIA metal within the source-side Group IIIA element layer 64S and the drain-side Group IIIA element layer 64D can be diffused into the substrate 8 by the anneal. A source-side diffusion region 70S is formed underneath the source region 60S, and a drain-side diffusion region 70D is formed underneath the drain region 60D. The source-side diffusion region 70S includes a vertical stack of a source-side doped substrate compound semiconductor material portion 72S and a source-side doped top compound semiconductor material portion 74S. The drain-side diffusion region 70D includes a vertical stack of a drain-side doped substrate compound semiconductor material portion 72D and a drain-side doped top compound semiconductor material portion 74D.

Each of the source-side doped substrate compound semiconductor material portion 72S and the drain-side doped substrate compound semiconductor material portion 72D includes the semiconductor material of the substrate compound semiconductor layer 10 and additionally includes at least one Group IIIA element that outdiffuses from the source-side Group IIIA element layer 64S during the anneal. Each of the source-side doped top compound semiconductor material portion 74S and the drain-side doped top compound semiconductor material portion 74D includes the semiconductor material of the top compound semiconductor layer 30 and additionally includes at least one Group IIIA element that outdiffuses from the source-side Group IIIA element layer 64S during the anneal.

The metallic materials in the source region 60S and the drain region 60D can provide reliable Ohmic contact employing an anneal at a temperature less than 500° C. Thus, a lower temperature anneal process can be employed to provide metallization contacts to the source region 60S and the drain region 60D of the present disclosure compared with source and drain regions of the prior art devices, the device profile of the HEMT of the present disclosure can be well defined by reducing the anneal temperature.

Figure 10:
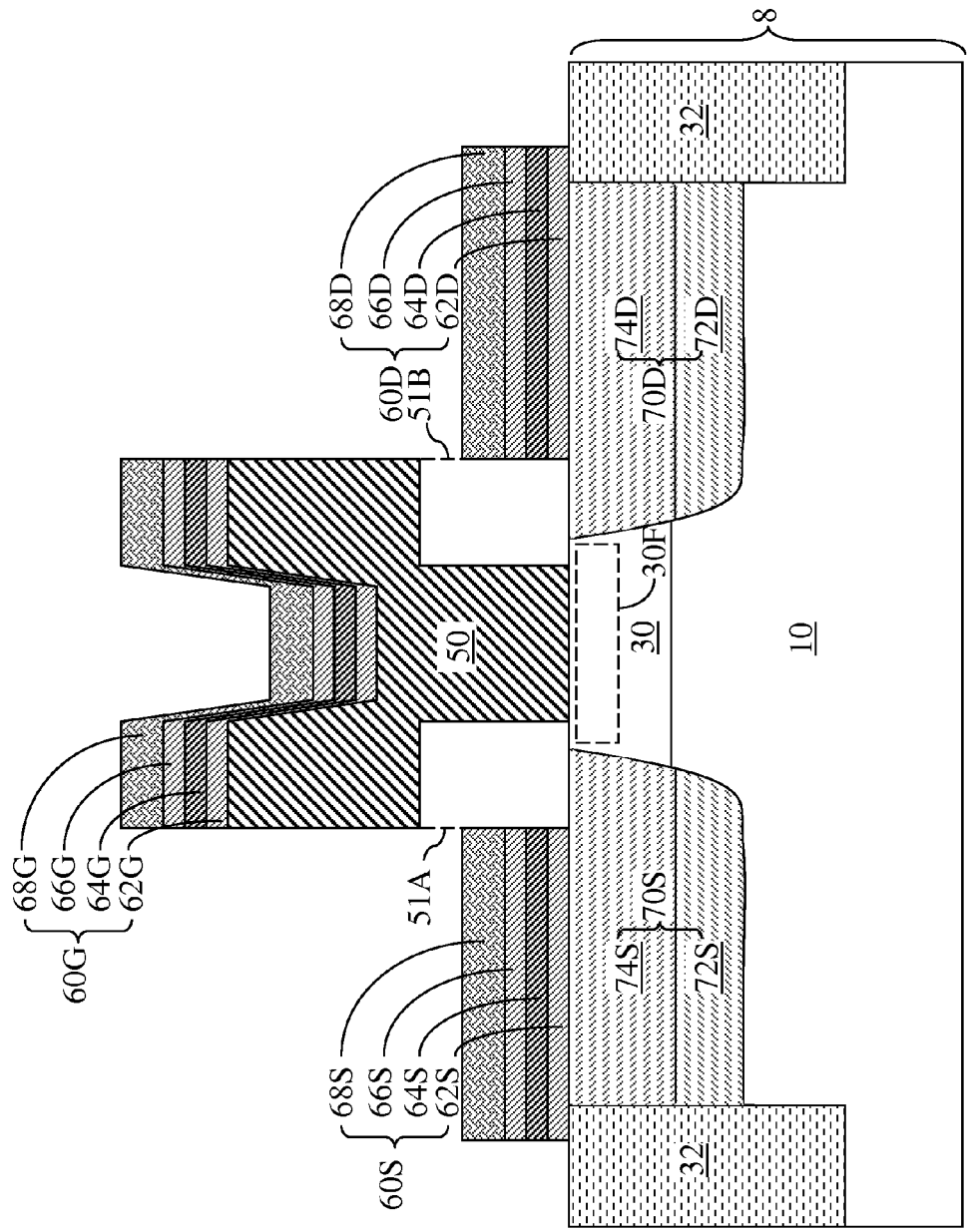
FIG. 10 is a vertical cross-sectional view of the first exemplary semiconductor structure after removal of the dielectric material layer according to the first embodiment of the present disclosure.

Referring to FIG. 10, the dielectric material layer 40 can be optionally removed selective to the metallic materials of the gate electrode 50, the gate electrode contact structure 60G, the source region 60S, the drain region 60D, and the semiconductor material of the top compound semiconductor layer 30. The dielectric material layer 40 can be removed, for example, by a wet etch. For example, if the dielectric material layer 40 includes silicon nitride, hot phosphoric etch can be employed. If the dielectric material layer 40 includes silicon oxide, hydrofluoric acid can be employed. Alternately, an isotropic plasma etching employing a hydrofluorocarbon gas (such as $CF_4$ or $CHF_3$) can be performed without direct current (DC) bias voltage to remove the dielectric material layer 40.

Figure 11:
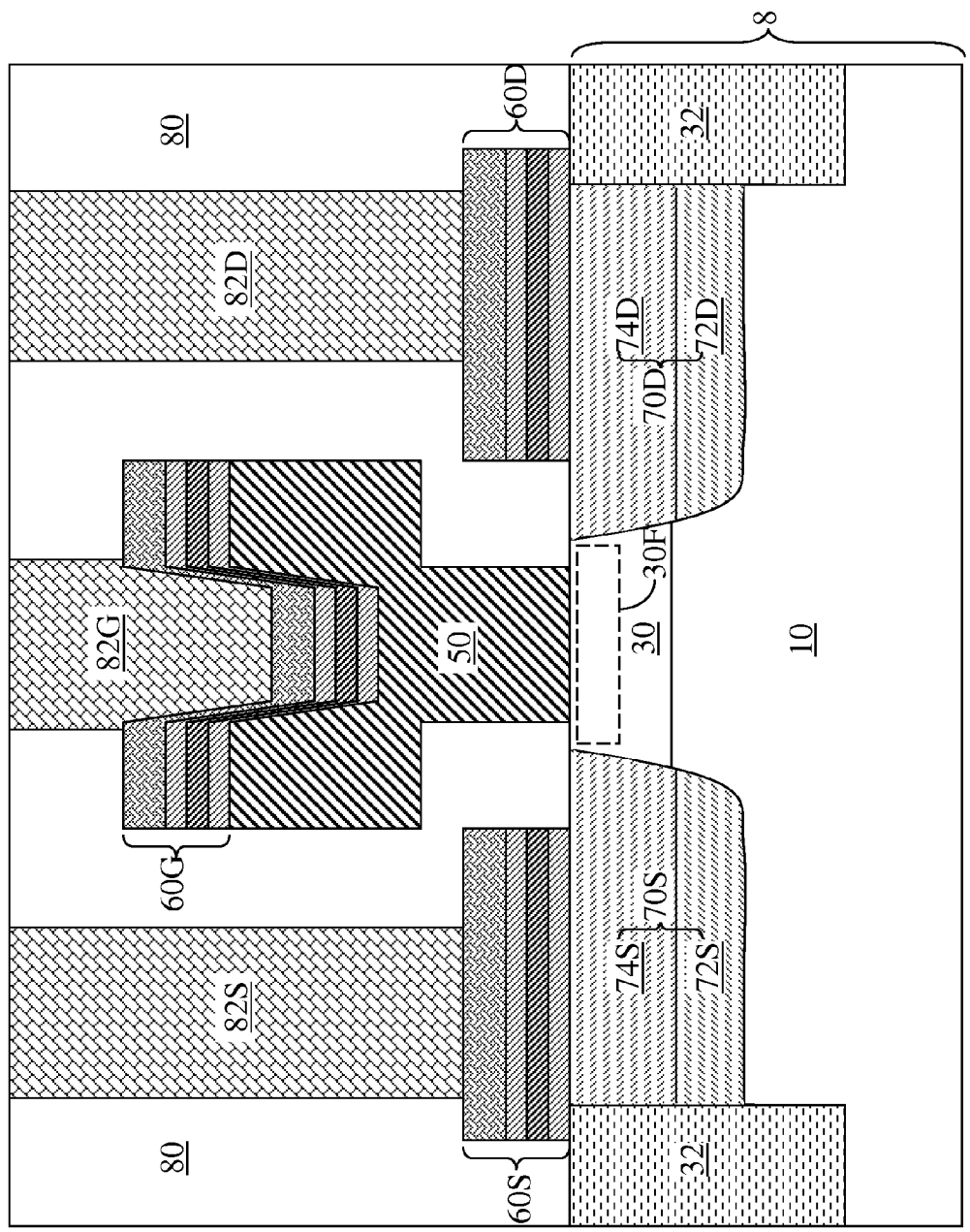
FIG. 11 is a vertical cross-sectional view of the first exemplary semiconductor structure after formation of a contact-level dielectric material layer and various contact structures therein according to the first embodiment of the present disclosure.

Referring to FIG. 11, a contact-level dielectric material layer 80 can be formed above the gate electrode contact structure 60G, the source region 60S, and the drain region 60D by depositing a dielectric material. The dielectric material of the contact-level dielectric material layer 80 can be, for example, silicon oxide, organosilicate glass (OSG), a spin-on glass (SOG), silicon nitride, or a combination thereof. The dielectric material of the contact-level dielectric material layer 80 can be deposited, for example, by chemical vapor deposition (CVD). Various contact structures can be formed through the contact-level dielectric material layer 80. The various contact structures can include, for example, a source-side contact via structure 82S that contacts the source region 60S, a drain-side contact via structure 82D that contacts the drain region 60D, and a gate-side contact via structure 82G that contacts the gate electrode contact structure 60G. The horizontal surface at which the gate electrode 50 contacts the top compound semiconductor layer 30 can be coplanar with the top surface of the top compound semiconductor layer 30.

Figure 12:
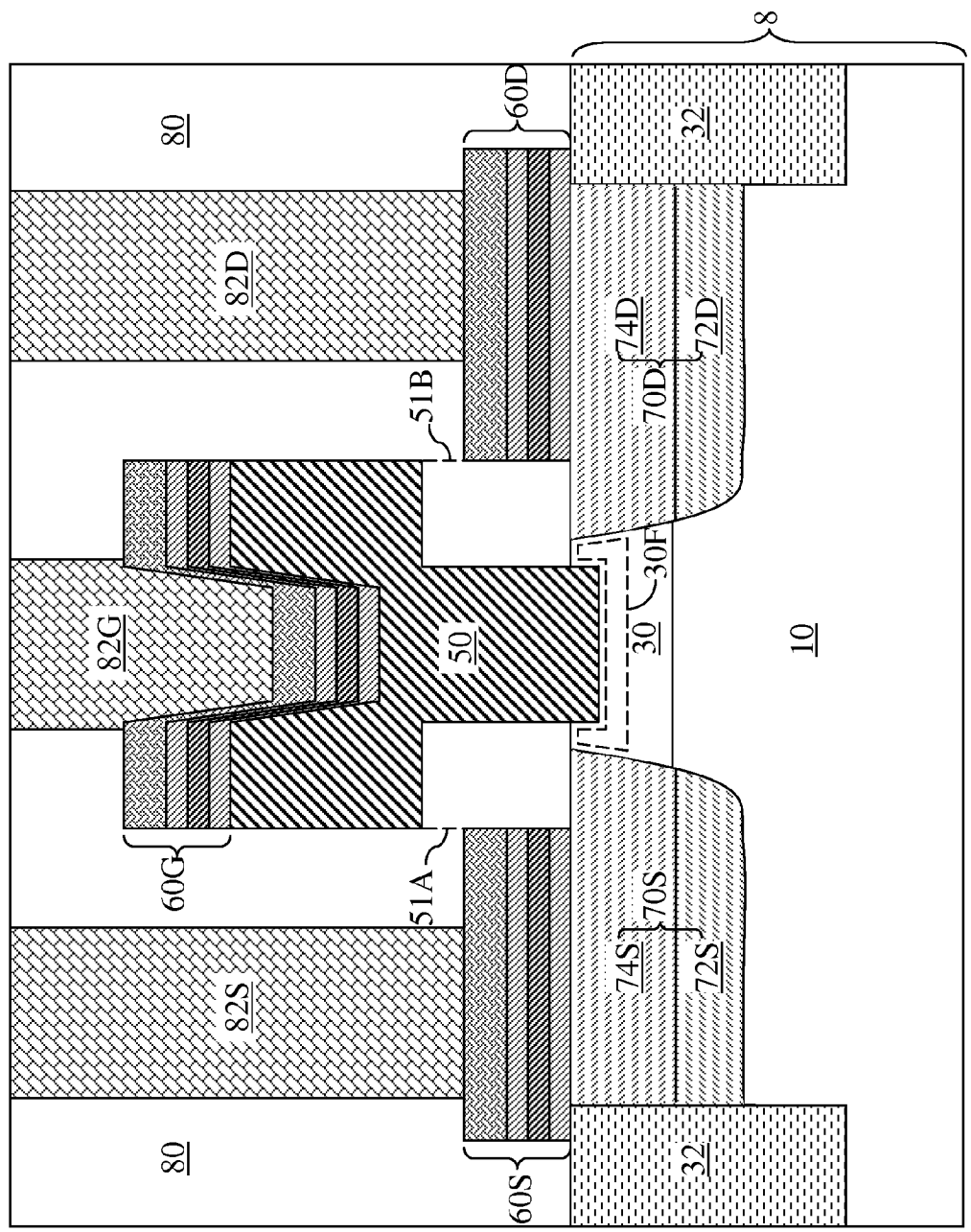
FIG. 12 is a vertical cross-sectional view of a variation of the first exemplary semiconductor structure according to the first embodiment of the present disclosure.

Referring to FIG. 12, a variation of the first exemplary semiconductor can be derived from the first exemplary semiconductor structure by altering the process for the anisotropic etch at the processing step of FIG. 4. The anisotropic etch that transfers the pattern in the insoluble first photoresist portion 42I through the dielectric material layer 40 is extended after the top surface of the top compound semiconductor layer 30 is physically exposed. The physically exposed surface of the top compound semiconductor layer 30 is recessed by the anisotropic etch such that a horizontal surface at the bottom of the cavity 42C' (See FIG. 4) is recessed to a depth between the top surface of the top compound semiconductor layer 30 and the bottom surface of the top compound semiconductor layer 30. A cavity 42C' that replicates the pattern of the first opening 42C (See FIG. 3) extends into the top compound semiconductor layer 30. The second opening 44C in the template material layer, i.e., the insoluble second photoresist portion 44I, can overlie the entirety of the cavity 42C'. The recessed surface of the top compound semiconductor layer 30 is physically exposed within the cavity 42C'.

Optionally, the anisotropic etch can employ a fluorine-including gas during the recessing of the horizontal surface of the top compound semiconductor layer 30. In this case, fluorine atoms in the plasma can be introduced into the top compound semiconductor layer 30 during the recessing of the second single crystalline compound semiconductor material, and can form a fluorine-doped region 30F. The fluorine-doped region 30F can be formed in a surface portion underneath the recessed horizontal surface of the top compound semiconductor layer 30. The fluorine-doped region 30F can have a thickness less than the thickness of the recessed portion of the top compound semiconductor layer 30, i.e., can be vertically spaced from the substrate compound semiconductor layer 10. In one embodiment the fluorine-doped region 30F can have a thickness in a range from 3 nm to 10 nm, although lesser and greater thicknesses can also be employed. The processing steps of FIGS. 5-10 are subsequently performed. In the variation of the first exemplary semiconductor structure, the horizontal surface within the interface between the gate electrode 50 and the top compound semiconductor layer 30 is recessed below the horizontal plane of the top surface of the top compound semiconductor layer 30.

Figure 13:
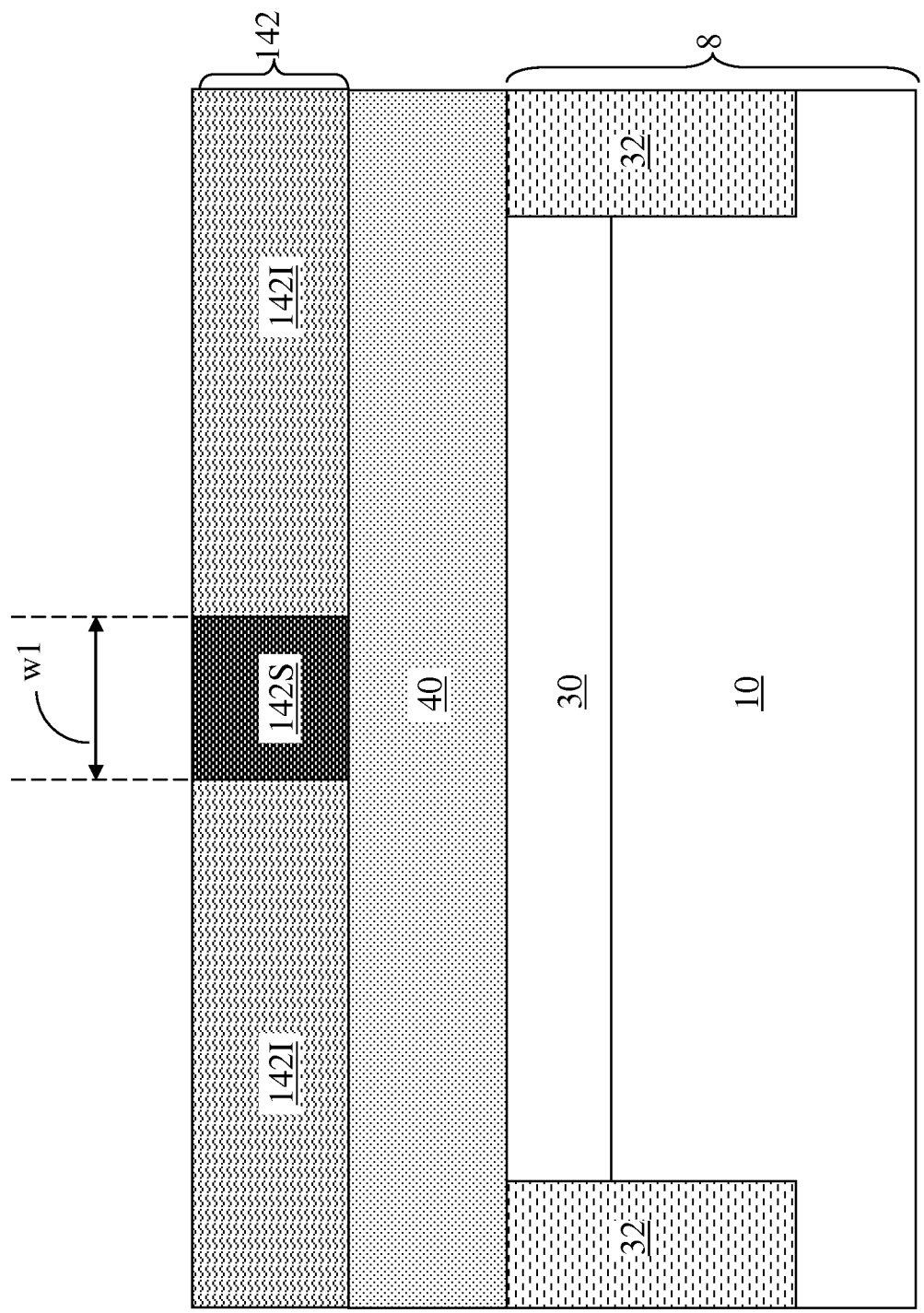
FIG. 13 is a vertical cross-sectional view of a second exemplary semiconductor structure after application and lithographic exposure of a first photoresist layer according to a second embodiment of the present disclosure.

Referring to FIG. 13, a second exemplary semiconductor structure according to a second embodiment of the present disclosure is derived by providing a substrate 8 as in the first exemplary semiconductor structure, optionally forming shallow trench isolation structures 32, and forming a dielectric material layer 40. The dielectric material layer 40 of the second embodiment can have the same composition as the dielectric material layer 40 of the first embodiment. The thickness of the dielectric material layer 40 of the second embodiment can be in a range of the sum of the first thickness t1 and the second thickness t2 of the first embodiment, i.e., in a range from 35 nm to 150 nm, although lesser and greater thicknesses can also be employed.

A first photoresist layer 142 is applied over the dielectric material layer 40. The first photoresist layer 142 is lithographically exposed to form a soluble first photoresist portion 142S and an insoluble first photoresist portion 142I. In one embodiment, the soluble first photoresist portion 142S can have a uniform width that is invariant along a horizontal direction perpendicular to the plane of FIG. 13. This uniform width is herein referred to as a first width w1.

Figure 14:
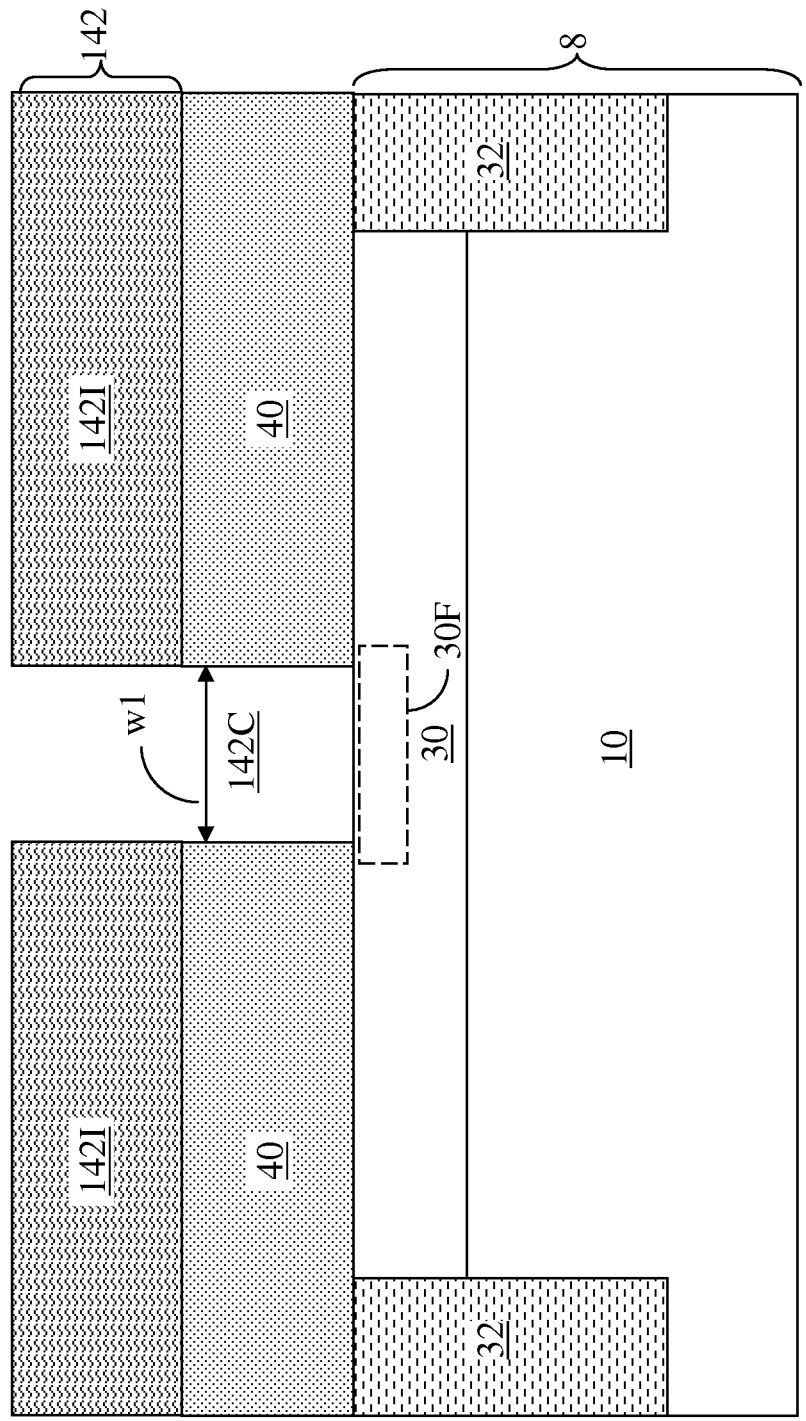
FIG. 14 is a vertical cross-sectional view of the second exemplary semiconductor structure after forming a cavity in the dielectric material layer employing the first photoresist layer as an etch mask and optionally forming a fluorine-doped region according to the second embodiment of the present disclosure.

Referring to FIG. 14, the soluble first photoresist portion 142S is removed, for example, by dissolving in a developer solution. A cavity 142C is formed in a volume from which the soluble first photoresist portion 142S is removed. The first cavity 142C can have the first width w1, and the second opening 44C can have the second width w2.

The pattern in the insoluble first photoresist portion 142I is transferred into the dielectric material layer 40 by an anisotropic etch. The anisotropic etch employs a remaining portion of the first photoresist layer 42, i.e., the insoluble first photoresist portion 142I, as an etch mask. The cavity 142C extends into the dielectric material layer 40.

Optionally, the anisotropic etch can employ a fluorine-including gas during the downward extension of the cavity 142C through the dielectric material layer 40. Further, the anisotropic etch can continue after the top surface of the top compound semiconductor layer 30 is physically exposed with a decreased plasma intensity. In this case, fluorine atoms in the plasma can be introduced into the top compound semiconductor layer 30 without significantly etching the second single crystalline compound semiconductor material, and can form a fluorine-doped region 30F. The fluorine-doped region 30F can be formed in a surface portion of the top compound semiconductor layer 30 directly underneath the cavity 142C in the dielectric material layer 40. The fluorine-doped region 30F can have a thickness less than the thickness of the top compound semiconductor layer 30, i.e., can be vertically spaced from the substrate compound semiconductor layer 10. In one embodiment the fluorine-doped region 30F can have a thickness in a range from 3 nm to 10 nm, although lesser and greater thicknesses can also be employed. The insoluble first photoresist portion 142I can be subsequently removed, for example, by ashing or a solvent wash.

Figure 15:
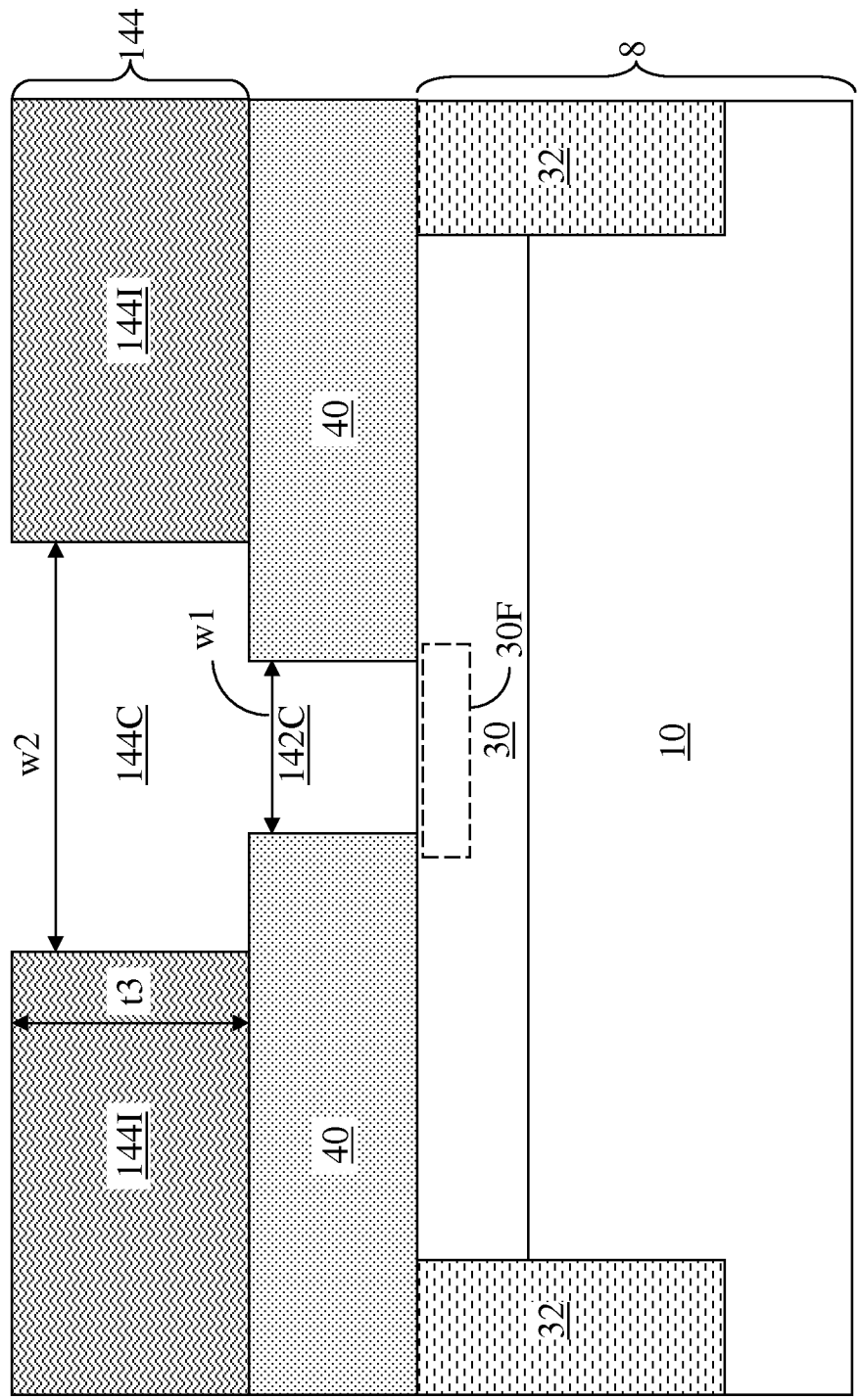
FIG. 15 is a vertical cross-sectional view of the second exemplary semiconductor structure after application and patterning of a second photoresist layer according to the second embodiment of the present disclosure.

Referring to FIG. 15, a second photoresist layer 144 may be applied over the dielectric material layer 40, and is patterned by lithographic exposure and development to form an opening 144C overlying the cavity 142C in the dielectric material layer 40. The thickness of the second photoresist layer 144 is herein referred to as a third thickness t3, which can have the same range as the third thickness t3 of the first embodiment. A remaining portion of the second photoresist layer 44 constitutes an insoluble second photoresist portion 44I. In one embodiment, the opening 144C can have a uniform width that is invariant along a horizontal direction perpendicular to the plane of FIG. 15. This uniform width is herein referred to as a second width w2. The second width w2 is greater than the first width w1.

The insoluble second photoresist portion 144I constitutes a template material layer including the opening 144C therein. The template material layer is formed over the dielectric material layer 40 after the transfer of the pattern in the insoluble first photoresist portion 142I into the dielectric material layer 40. The opening 144C in the template material layer, i.e., the insoluble second photoresist portion 144I, can overlie the entirety of the cavity 142C. A portion of the top surface of the top compound semiconductor layer 30 is physically exposed within the cavity 142C.

Figure 16:
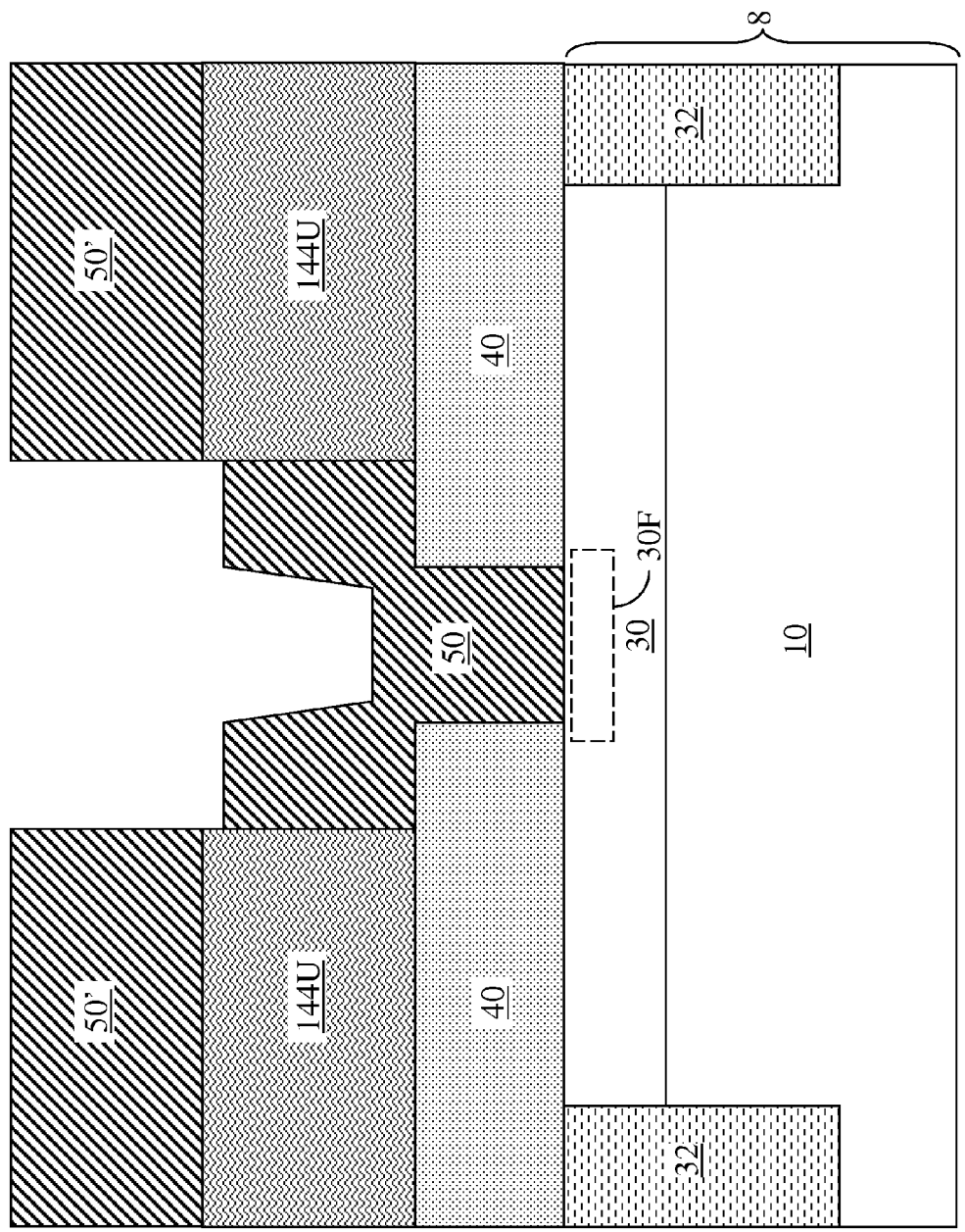
FIG. 16 is a vertical cross-sectional view of the second exemplary semiconductor structure after formation of a gate electrode by a directional deposition of at least one conductive material according to the second embodiment of the present disclosure.

Referring to FIG. 16, the processing steps of FIG. 5 can be performed in the same manner as in the first embodiment. Subsequently, the processing steps of FIG. 6 can be performed in the same manner as in the first embodiment. For example, the second photoresist layer 144 can be removed selective to the dielectric material layer 40 and the gate electrode 50 employing the same method as in the first embodiment. The conductive material portion 50' can be lifted off within the solvent as the second photoresist layer 144 is dissolved. The dielectric material layer 40 can be patterned by an anisotropic etch that employing the gate electrode 50 as an etch mask in the same manner as in the first embodiment.

Figure 17:
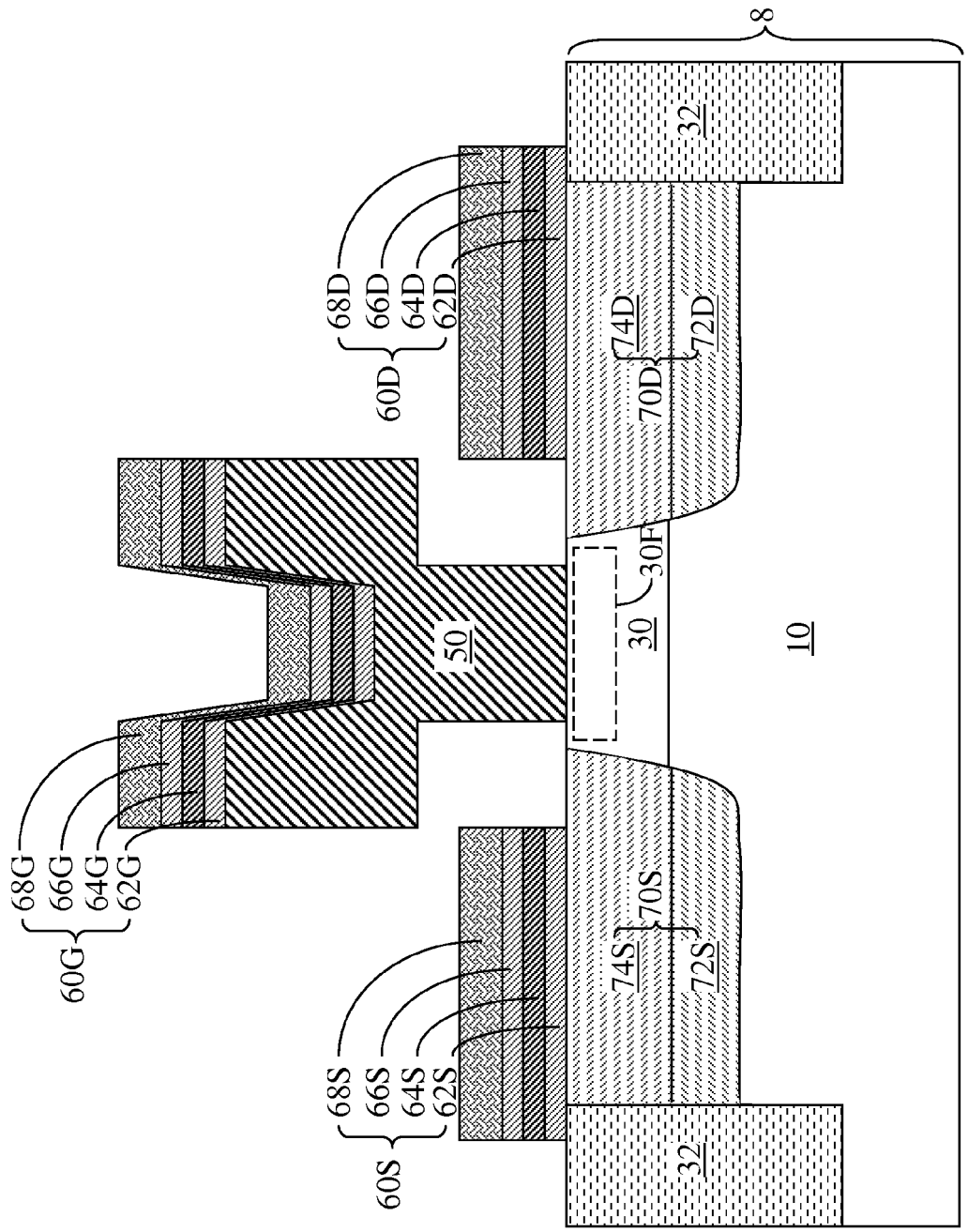
FIG. 17 is a vertical cross-sectional view of the second exemplary semiconductor structure after formation of a source region and a drain region according to the second embodiment of the present disclosure.

Referring to FIG. 17, the processing steps of FIG. 7 can be performed. After the patterning of the dielectric material layer 40, a first sidewall of the remaining portion of the dielectric material layer 40 can be vertically coincident with a first sidewall of the upper portion of the gate electrode 50, and a second sidewall of the remaining portion of the dielectric material layer 40 can be vertically coincident with a second sidewall of the upper portion of the gate electrode 50. The first sidewall of the upper portion of the gate electrode 50 and the first sidewall of the dielectric material layer 40 can be within a first vertical plane, and the second sidewall of the upper portion of the gate electrode 50 and the second sidewall of the dielectric material layer 40 can be within a second vertical plane.

Subsequently, the processing steps of FIGS. 8 and 9 can be performed in the same manner as in the first embodiment. Optionally, the processing steps of FIG. 10 can be performed to provide the second exemplary semiconductor structure illustrated in FIG. 17.

Figure 18:
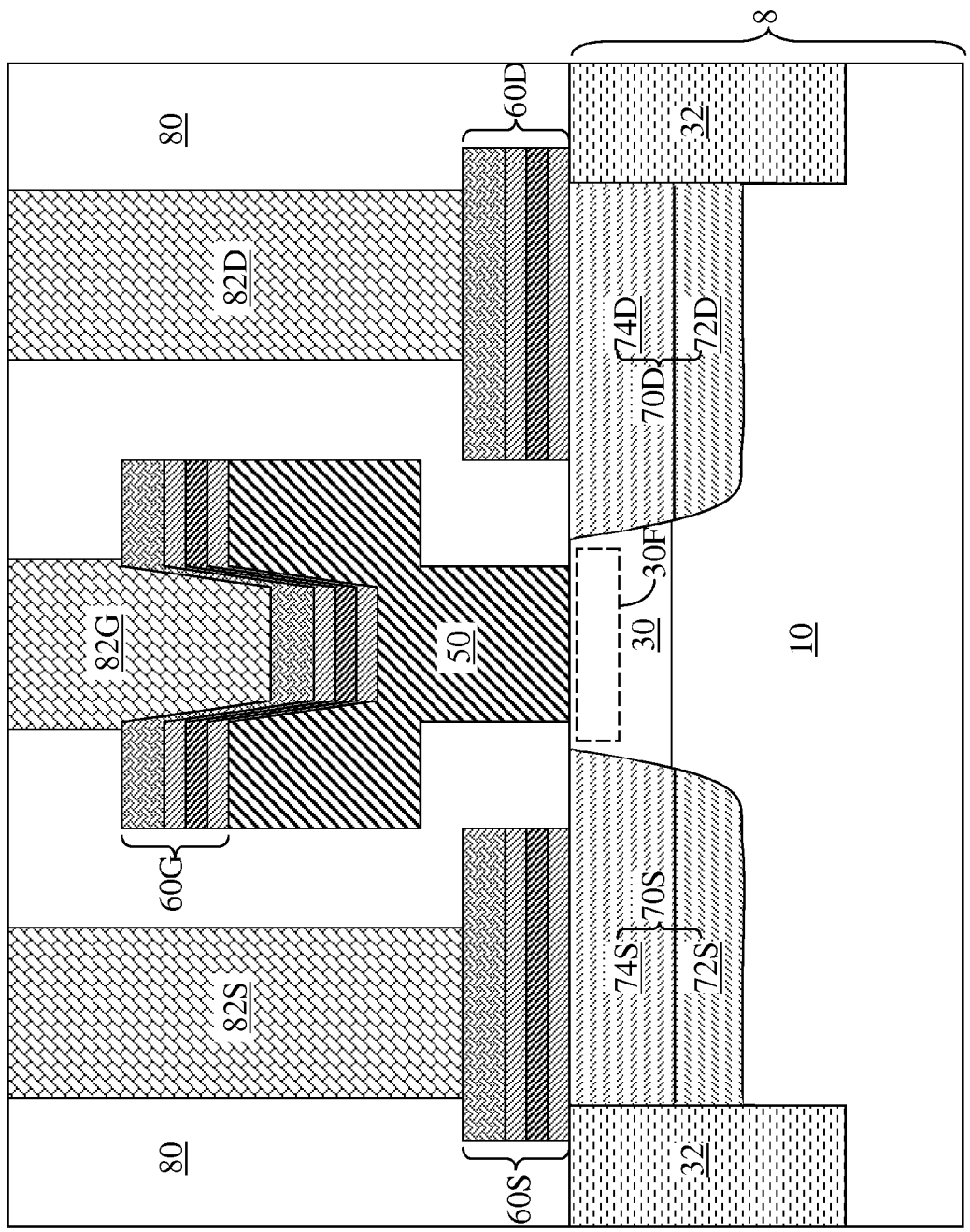
FIG. 18 is a vertical cross-sectional view of the second exemplary semiconductor structure after formation of a contact-level dielectric material layer and various contact structures therein according to the second embodiment of the present disclosure.

Referring to FIG. 18, the processing steps of FIG. 11 can be subsequently performed.

Figure 19:
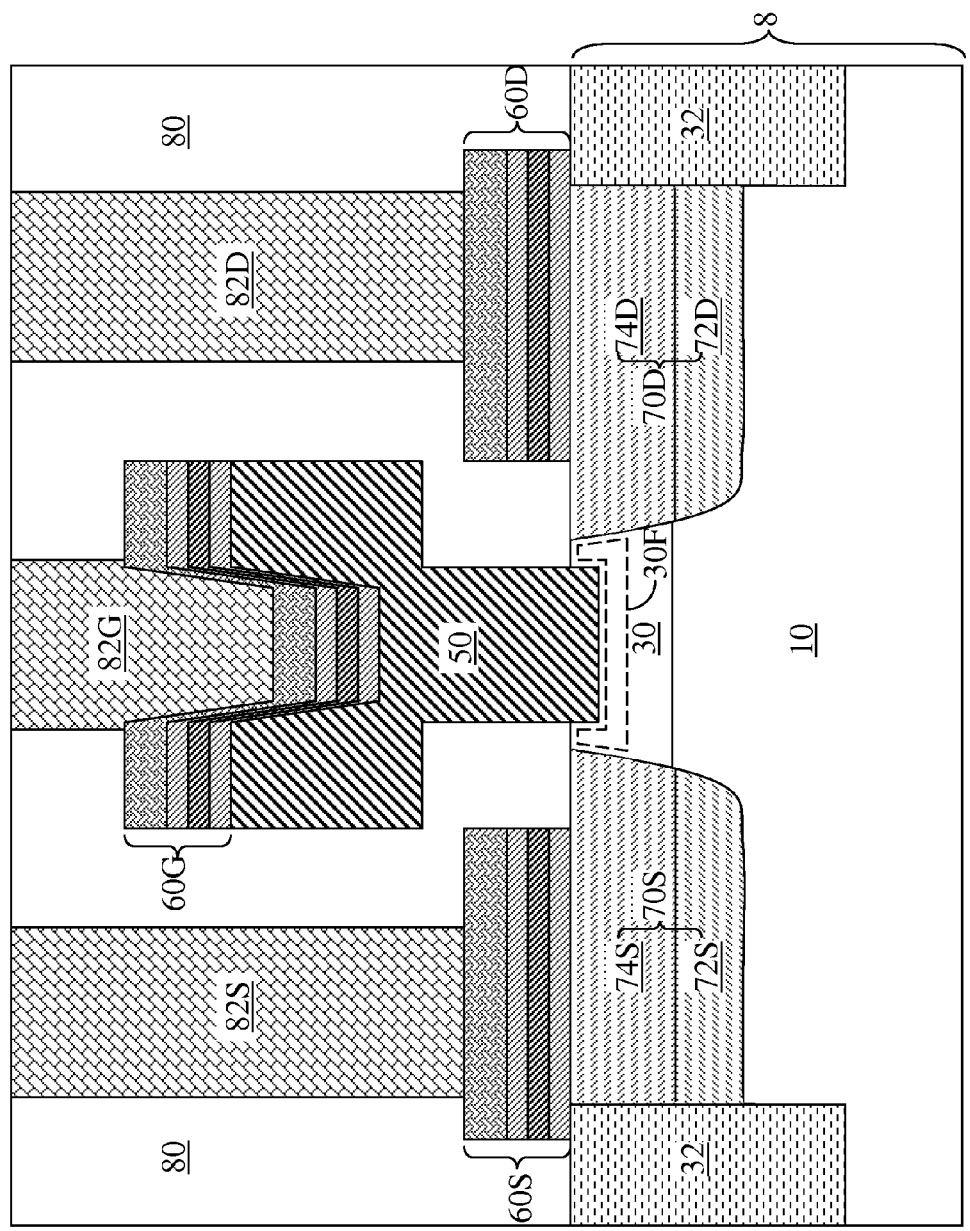
FIG. 19 is a vertical cross-sectional view of a variation of the second exemplary semiconductor structure according to the second embodiment of the present disclosure.

Referring to FIG. 19, a variation of the second exemplary semiconductor structure can be derived from the second exemplary semiconductor structure by performing the same variations to the processing sequence of the second embodiment as the variations to the processing steps of the first embodiment that are employed to form the variation of the first exemplary semiconductor structure illustrated in FIG. 12.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A semiconductor structure comprising a high electron mobility transistor (HEMT), wherein said HEMT comprises:
a substrate including a stack of a substrate compound semiconductor layer and a top compound semiconductor layer;
a gate stack including, from bottom to top, a gate electrode and a gate electrode contact structure, wherein said gate electrode is of unitary construction and comprises a lower vertical portion contacting a horizontal surface of a portion of said top compound semiconductor layer, a horizontal portion located on said lower vertical portion and extending beyond sidewalls of said lower vertical portion, and a first vertical arm portion and a second vertical arm portion extending upward from either end of said horizontal portion, said horizontal portion and said first and said second vertical arm portions defining a cavity, and wherein said gate contact structure is located over top surfaces of said first and said second vertical arm portions and sidewalls and a bottom of said cavity;
a source region contacting a first portion of a top surface of said top compound semiconductor layer; and
a drain region contacting a second portion of said top surface of said top compound semiconductor layer, wherein said second portion is laterally spaced from said first portion by a width of said horizontal portion of said gate electrode, and wherein each of said gate electrode contact structure, said source region, and said drain region comprises a vertical stack, from bottom to top, of a first refractory metal barrier layer, a Group IIIA element layer, a second refractory metal barrier layer, and an oxidation-resistant metallic layer;
a source-side diffusion region located beneath said source region and comprising a first portion of said top compound semiconductor layer; and
a drain-side diffusion region located beneath said drain region and comprising a second portion of said top compound semiconductor layer,
wherein each of said first portion and said second portion of said to compound semiconductor layer is doped with said Group IIIA element from said Group IIIA element layer, and
wherein said source-side diffusion region and said drain-side diffusion region are laterally spaced from each other by a fluorine-doped region located within said portion of said top compound semiconductor layer and underlying said horizontal surface.

2. The semiconductor structure of claim 1, wherein said first refractory metal barrier layer and said second refractory metal barrier layer are essentially free of nitrogen.

3. The semiconductor structure of claim 1, wherein said first refractory metal barrier layer consists essentially of at least one first elemental refractory metal, and said second refractory metal barrier layer consists essentially of at least one second elemental refractory metal.

4. The semiconductor structure of claim 1, wherein said first refractory metal barrier layer and said second refractory metal barrier layer consist essentially of elemental molybdenum.

5. The semiconductor structure of claim 1, wherein said Group IIIA element layer consists essentially of aluminum.

6. The semiconductor structure of claim 1, wherein said lower vertical portion of said gate electrode has a first width, and said horizontal portion of said gate electrode includes a pair of sidewalls laterally spaced by said width that is greater than said first width.

7. The semiconductor structure of claim 6, wherein a sidewall of said source region and a sidewall of said first vertical arm portion are vertically coincident with one of said pair of sidewalls, and a sidewall of said drain region and a sidewall of said second vertical arm portion are vertically coincident with another of said pair of sidewalls.

8. The semiconductor structure of claim 1, wherein said horizontal surface is coplanar with said top surface of said top compound semiconductor layer.

9. The semiconductor structure of claim 1, wherein said horizontal surface is recessed below a plane of said top surface of said top compound semiconductor layer.

10. The semiconductor structure of claim 1, wherein a gate-side first refractory metal barrier layer within said gate electrode contact structure includes two horizontal portions vertically offset from each other and another portion contacting said sidewalls of said cavity and adjoined to said two horizontal portions.

11. The semiconductor structure of claim 10, wherein a source-side first refractory metal barrier layer within said source region and a drain-side first refractory metal barrier layer within said drain region have a same thickness as said gate-side first refractory metal barrier layer.

12. The semiconductor structure of claim 1, wherein material compositions and layer thicknesses of each of said first refractory metal barrier layers, said Group IIIA element layers, said second refractory metal barrier layers, and said oxidation-resistant metallic layers within said three vertical stacks for said source region, said drain region, and said gate electrode contact structure are the same.

13. The semiconductor structure of claim 1, wherein said source-side diffusion region further comprises a first portion of said substrate compound semiconductor layer, and said drain-side diffusion region further comprises a second portion of said substrate compound semiconductor layer, wherein each of said first portion and said second portion of said substrate compound semiconductor layer is doped with said Group IIIA element from said Group IIIA element layer.

14. The semiconductor structure of claim 1, wherein said horizontal surface of said portion of said top compound semiconductor layer is a topmost surface of said top compound semiconductor layer.

* * * * *